(12) United States Patent
Lim et al.

(10) Patent No.: US 11,927,785 B2
(45) Date of Patent: Mar. 12, 2024

(54) HOLOGRAPHIC OPTICAL ELEMENT AND METHOD OF FORMING THEREOF

(71) Applicant: SINGAPORE UNIVERSITY OF TECHNOLOGY AND DESIGN, Singapore (SG)

(72) Inventors: Tze Peng Kevin Lim, Singapore (SG); Kwang Wei Joel Yang, Singapore (SG); Hailong Liu, Singapore (SG)

(73) Assignee: SINGAPORE UNIVERSITY OF TECHNOLOGY AND DESIGN, Singapore (SG)

( * ) Notice: Subject to any disclaimer, the term of this patent is extended or adjusted under 35 U.S.C. 154(b) by 582 days.

(21) Appl. No.: 17/047,074

(22) PCT Filed: Apr. 15, 2019

(86) PCT No.: PCT/SG2019/050213
§ 371 (c)(1),
(2) Date: Oct. 13, 2020

(87) PCT Pub. No.: WO2019/199235
PCT Pub. Date: Oct. 17, 2019

(65) Prior Publication Data
US 2021/0364686 A1 Nov. 25, 2021

(30) Foreign Application Priority Data
Apr. 13, 2018 (SG) ............................ 10201803137R

(51) Int. Cl.
*G02B 5/32* (2006.01)
*G03H 1/00* (2006.01)
(Continued)

(52) U.S. Cl.
CPC ............. *G02B 5/32* (2013.01); *G03H 1/0011* (2013.01); *G03H 1/26* (2013.01); *B42D 25/328* (2014.10);
(Continued)

(58) Field of Classification Search
None
See application file for complete search history.

(56) References Cited

U.S. PATENT DOCUMENTS 3,957,353 A 5/1976 Fienup et al.
4,277,138 A 7/1981 Dammann
(Continued)

OTHER PUBLICATIONS

Huang et al; "Metasurface holography : from fundamentals to applications; Nanophotonics"; Mar. 15, 2018; pp. 1169-1190; vol. 7, No. 6.
(Continued)

*Primary Examiner* — Jennifer D. Carruth

(57) ABSTRACT

There is provided a holographic optical element including: a hologram portion including a plurality of groups of unit regions, each group of unit regions of the hologram portion being configured to produce a respective holographic image under a respective light illumination having a respective predetermined wavelength; and a colour filter portion formed on the hologram portion, the colour filter portion including a plurality of groups of unit regions, each group of unit regions of the colour filter portion being arranged on a corresponding group of the plurality of groups of unit regions of the hologram portion, whereby the plurality of groups of unit regions of the colour filter portion is spatially arranged to form a predetermined colour image. There is also provided a method of forming the holographic optical element. There is further provided an article having optical security incorporated therein.

20 Claims, 24 Drawing Sheets

(51) Int. Cl.
G03H 1/26 (2006.01)
B42D 25/328 (2014.01)
(52) U.S. Cl.
CPC ... *G03H 2001/261* (2013.01); *G03H 2223/15* (2013.01)

(56) References Cited

U.S. PATENT DOCUMENTS

| | | | |
|---|---|---|---|
| 4,421,380 A | 12/1983 | McGrew | |
| 4,506,949 A | 3/1985 | Knop | |
| 6,256,123 B1* | 7/2001 | Hazama | G02B 5/32 349/5 |
| 6,342,969 B1 | 1/2002 | Lee | |
| 2007/0273944 A1 | 11/2007 | Grier et al. | |

OTHER PUBLICATIONS

Mohammad et al.; "Full-color, large area, transmissive holograms enabled by multi-level diffractiv optics"; Scientific Reports; Jul. 19, 2017; 6 pages; vol. 7, No. 5789.
Nawrot et al: "Transmission phase gratings fabricated with direct laser writing as color filters in the visible"; Optics Express; Dec. 16, 2013; 6 pages; vol. 21, No. 26.
International Search Report issued for corresponding PCT-Application No. PCT/SG2019/050213, dated Jul. 1, 2019, 4 pages (for informational purpose only).
Matoba et al.; "Optical Techniques for Information Security"; IEEE; Jun. 6, 2009; vol. 97; No. 6; pp. 1128-1148; Invited Paper.
Javidi et al.; ". Roadmap on optical security"; Journal of Optics; Jul. 22, 2016; pp. 1-40; IOP Publishing.
Knop; "Color pictures using the zero diffraction order of phase grating structures"; Optics Communication; Aug. 1976; vol. 18; No. 3; 6 pages.
Kumar et al.; "Printing colour at the optical diffraction limit"; Nature Nanotechnology; Sep. 2012; vol. 7; pp. 557-561.
Sun et al.; "All-dielectric full-color printing with TiO2 metasurfaces"; ACS Nano; Mar. 19, 2017; p. 4445-4452; American Chemical Society.
Lohmann et al.; "Binary Fraunhofer holograms, generated by computer"; Applied Optics; Oct. 1967; vol. 6; No. 10; pp. 1739-1748.
Goh et al.; "Three-dimensional plasmonic stereoscopic prints in full colour"; Nature Communications; Nov. 4, 2014; 8 pages; Macmillan Publishers Limited.
Huang et al.; "Aluminum plasmonic multicolor meta-hologram"; Nano Letters; Apr. 6, 2015; 6 pages; ACS Publications.
Zhao et al.; "Full-color hologram using spatial multiplexing of dielectric metasurface"; Optics Letters; Jan. 1, 2016; vol. 41; No. 1; pp. 147-150.
Wang et al.; "Visible-frequency dielectric metasurfaces for multiwavelength achromatic and highly dispersive holograms" ; Nano Letters; Jul. 11, 2016; pp. 5235-5240; ACS Publications.
Wan et al.; "Full-color plasmonic metasurface holograms"; ACS Nano; Sep. 21, 2016; 10 pages; ACS Publications.
Li et al.; "Multicolor 3D meta-holography by broadband plasmonic modulation"; Science Advances; Nov. 4, 2016; 7 pages; American Association for the Advancement of Science (AAAS).
Barton et al.; "Dual-wavelength operation diffractive phase elements for pattern formation"; Optics Express ; Jul. 21, 1997; vol. 1; No. 2; pp. 54-59; Optical Society of America.
Bengtsson; "Kinoforms designed to produce different fan-out patterns for two wavelengths"; Applied Optics; Apr. 10, 1998; vol. 37; No. 11; pp. 2011-2020; Optical Society of America.
Levy et al.; "Simultaneous multicolor image formation with a single diffractive optical element"; Optic Letters; Aug. 1, 2001; vol. 26; No. 15; pp. 1149-1151.
Lee et al.; "Robustness of holographic optical traps against phase scaling errors"; Optics Express; Sep. 19, 2005; vol. 13; No. 19; pp. 7458-7465.
Gissibl et al.; "Refractive index measurements of photo-resists for three-dimensional direct laser writing"; Optical Materials Express; Jul. 1, 2017; vol. 7; No. 7; 6 pages.
Zheng et al.; "Waveguide-based optical phased array"; IEEE Photonics Technology Letter; Sep. 15, 2013; vol. 25; No. 18; pp. 1826-1828.
Gerchberg et al.; "A practical algorithm for the determination of phase from Image and Diffraction Plane Pictures"; Optik; 1972; vol. 35; No. 2 ; pp. 237-246.
Doskolovich et al.; "Design of DOEs for wavelength demultiplexing and spatial focusing"; IOP Science; Jul. 12, 2000; 7 pages ; IOP Publishing Limited.
Doskolovich et al.; "Design of DOEs for wavelength division and focusing"; Journal of Modern Optics; Apr. 15, 2005; vol. 52; No. 6; pp. 917-926; Taylor & Francis.
Jesacher et al.; "Colour hologram projection with an SLM by exploiting its full phase modulation range"; Optics Express; Aug. 25, 2014; vol. 22; No. 17; pp. 20530-20541; Optical Society of America.
Makowski et al.; "Colorful reconstructions from a thin multi-plane phase hologram"; Optics Express; Jul. 21, 2008; vol. 16; No. 15; pp. 11618-11623; Optical Society of America.
Shimobaba et al; "Numerical study of color holographic projection using space-division method"; Optics Express; May 23, 2011, vol. 19; No. 11; pp. 10287-10292; Optical Society of America.
Ito et al.; "Color electroholography by three colored reference lights simultaneously incident upon one hologram panel"; Optics Express; Sep. 6, 2004; vol. 12; No. 18; pp. 4320-4325; Optical Society of America.
Ni et al.; "Metasurface holograms for visible light"; Nature Communications; Nov. 15, 2013; 6 pages ; Macmillan Publishers Limited.
Makowski et al.; "Simple holographic projection in color"; Optics Express; Oct. 22, 2012; vol. 20; No. 22; pp. 25130-25136; Optical Society of America.
Fienup et al.; "New ways to make computer-generated color holograms"; Nouv. Rev. Optique; 1974; T.5; No. 5; pp. 269-275.
Dammann; "Color separation gratings"; Applied Optics; Aug. 1, 1978; vol. 17; No. 15; pp. 2273-2279; Optical Society of America.
Chu et al.; "Multiemulsion On-Axis Computer Generated Hologram"; Applied Optics; Jul. 1973; vol. 12; No. 7; pp. 1386-1388.
Farn et al.; "Color separation by use of binary optics". Optics Letters; Aug. 1, 1993, vol. 18; No. 15, pp. 1214-1216; Optical Society of America.
Noach et al.; "Integrated diffractive and refractive elements for spectrum shaping" Applied Optics; Jul. 1, 1996; vol. 35; No. 19 pp. 3635-3639; Optical Society of America.
Turunen et al.; "Storage of multiple images in a thin synthetic Fourier hologram"; Optics Communications; Aug. 1, 1991; vol. 84, No. 5,6; pp. 383-392; Elsevier Science Publishers B.V.

* cited by examiner

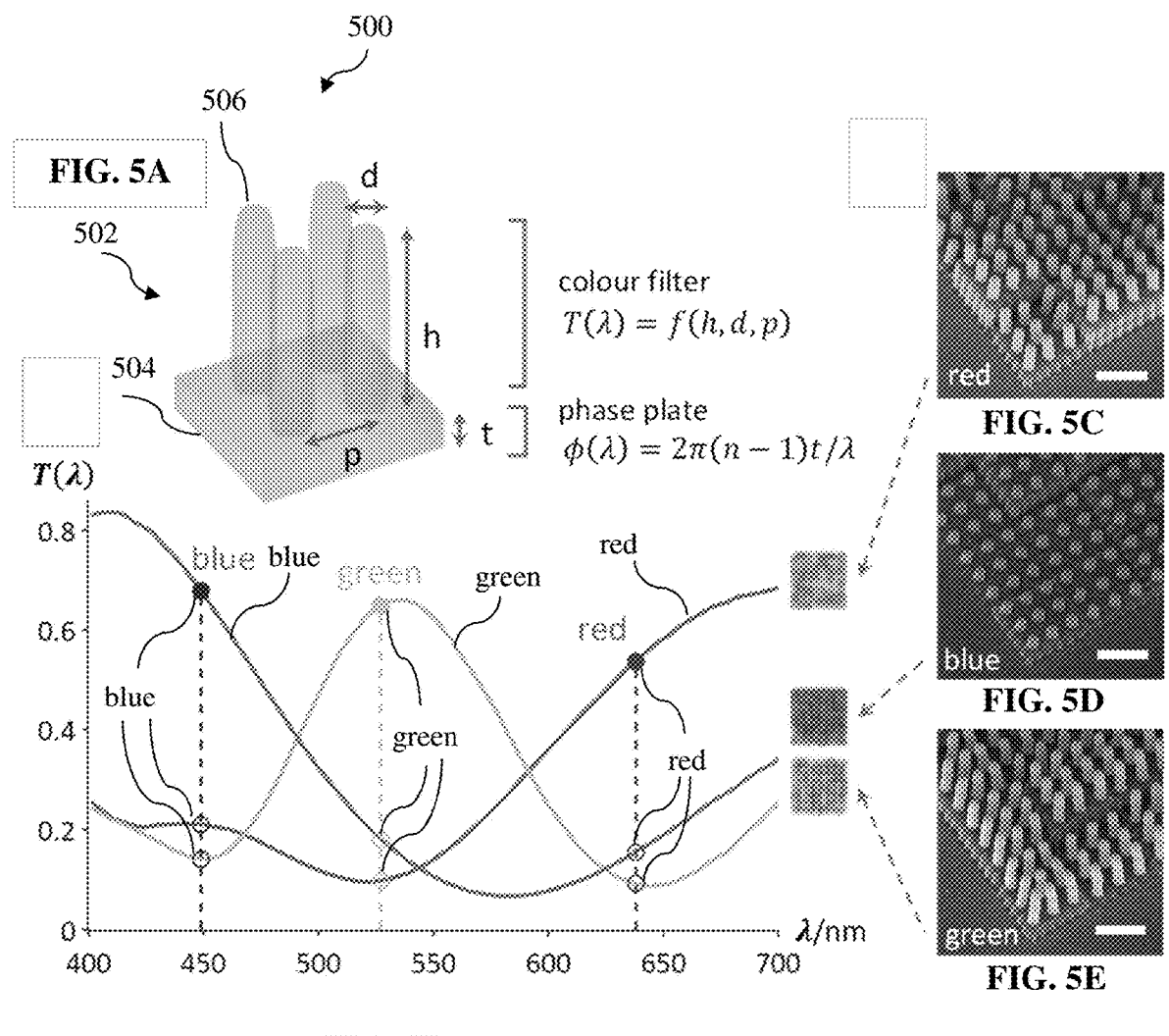

| Colour | Nominal Height | Nominal Diameter | Transmittance | | | |
|---|---|---|---|---|---|---|
| | | | Blue (449±2 nm) | Green (527±2 nm) | Red (638±2 nm) | White (450–650 nm) |
| Red | 1.9 μm | 390 nm | 21.0% | 9.8% | 53.7% | 24.9% |
| Orange | 1.7 μm | 380 nm | 23.2% | 24.0% | 71.2% | 39.8% |
| Yellow | 1.5 μm | 380 nm | 13.7% | 42.3% | 68.3% | 47.7% |
| Green | 2.6 μm | 390 nm | 14.1% | 64.8% | 9.2% | 36.5% |
| Blue | 0.7 μm | 380 nm | 67.8% | 18.1% | 15.5% | 22.3% |
| Purple | 1.1 μm | 300 nm | 59.7% | 13.6% | 22.6% | 21.0% |

FIG. 12

| Selectivity of transmission | at blue wavelength | at green wavelength | at red wavelength |
|---|---|---|---|
| purple filter vs green filter | 59.7% ÷ 14.1% = 4.2 | | |
| purple filter vs yellow filter | 59.7% ÷ 13.7% = 4.4 | | |
| purple filter vs orange filter | 59.7% ÷ 23.2% = 2.6 | | |
| purple filter vs red filter | 59.7% ÷ 21.0% = 2.8 | | |
| blue filter vs green filter | 67.8% ÷ 14.1% = 4.8 | | |
| blue filter vs yellow filter | 67.8% ÷ 13.7% = 4.9 | | |
| blue filter vs orange filter | 67.8% ÷ 23.2% = 2.9 | | |
| blue filter vs red filter | 67.8% ÷ 21.0% = 3.2 | | |
| green filter vs purple filter | | 64.8% ÷ 13.6% = 4.8 | |
| green filter vs blue filter | | 64.8% ÷ 18.1% = 3.6 | |
| green filter vs yellow filter | | 64.8% ÷ 42.3% = 1.5 | |
| green filter vs orange filter | | 64.8% ÷ 24.0% = 2.7 | |
| green filter vs red filter | | 64.8% ÷ 9.8% = 6.6 | |
| orange filter vs purple filter | | | 71.2% ÷ 22.6% = 3.2 |
| orange filter vs blue filter | | | 71.2% ÷ 15.5% = 4.6 |
| orange filter vs green filter | | | 71.2% ÷ 9.2% = 7.7 |
| orange filter vs yellow filter | | | 71.2% ÷ 68.3% = 1.0 |
| red filter vs purple filter | | | 53.7% ÷ 22.6% = 2.4 |
| red filter vs blue filter | | | 53.7% ÷ 15.5% = 3.5 |
| red filter vs green filter | | | 53.7% ÷ 9.2% = 5.8 |
| red filter vs yellow filter | | | 53.7% ÷ 68.3% = 0.8 |
| yellow filter vs purple filter | | 42.3% ÷ 13.6% = 3.1 | 68.3% ÷ 22.6% = 3.0 |
| yellow filter vs blue filter | | 42.3% ÷ 18.1% = 2.3 | 68.3% ÷ 15.5% = 4.4 |
| yellow filter vs green filter | | 42.3% ÷ 64.8% = 0.7 | 68.3% ÷ 9.2% = 7.4 |
| yellow filter vs orange filter | | 42.3% ÷ 24.0% = 1.8 | 68.3% ÷ 71.2% = 1.0 |
| yellow filter vs red filter | | 42.3% ÷ 9.8% = 4.3 | 68.3% ÷ 53.7% = 1.3 |

FIG. 13

| (power in units of mW) | Blue laser (449 nm) | Red laser (638 nm) |
|---|---|---|
| Incident power | 1.80 | 2.10 |
| Transmitted power | 1.68 | 1.90 |
| Power in central projection | 0.53 | 0.64 |
| Power in zero-order spot | 0.15 | 0.34 |
| Glass transmission efficiency | $1.68 \div 1.80 \times 100\% = 93\%$ | $1.90 \div 2.10 \times 100\% = 90\%$ |
| Filter transmission efficiency | $0.53 \div 1.68 \times 100\% = 32\%$ | $0.64 \div 1.90 \times 100\% = 34\%$ |
| Hologram diffraction efficiency | $(0.53-0.15) \div 0.53 \times 100\% = 72\%$ | $(0.64-0.34) \div 0.64 \times 100\% = 47\%$ |
| Overall efficiency of print | $(0.53-0.15) \div 1.80 \times 100\% = 21\%$ | $(0.64-0.34) \div 2.10 \times 100\% = 14\%$ |

FIG. 21

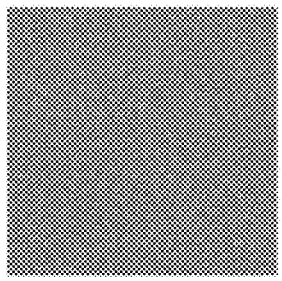
FIG. 22A
*random*
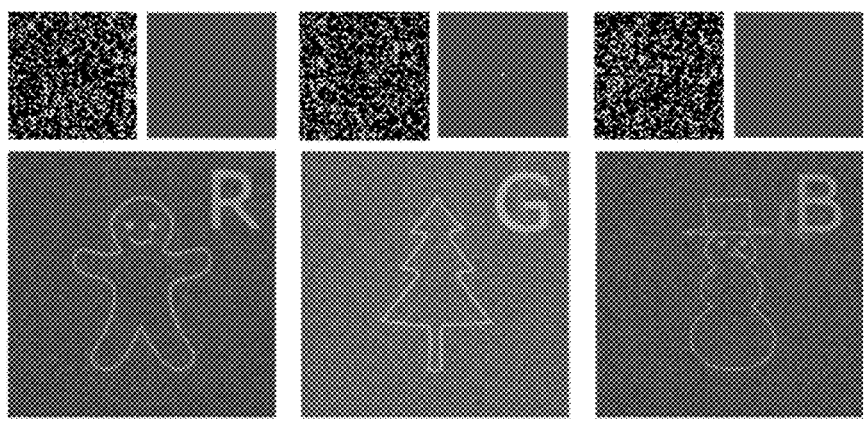
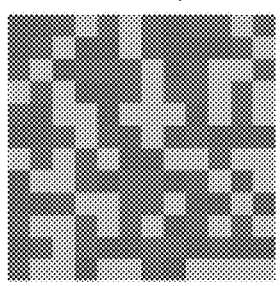
FIG. 22B
*blocky*
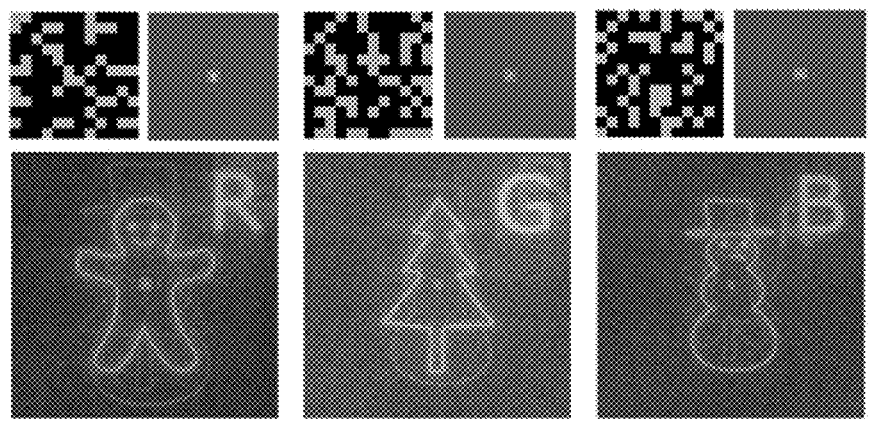
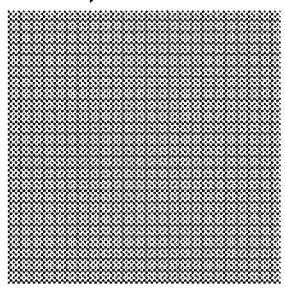
FIG. 22C
*periodic*
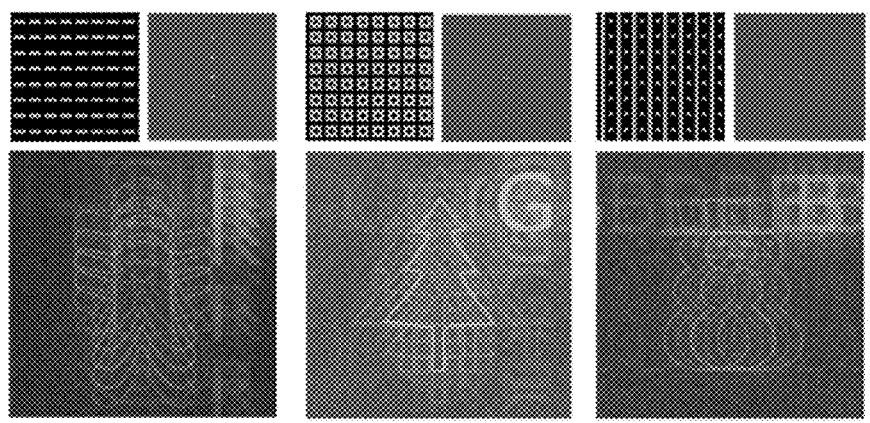

HOLOGRAPHIC OPTICAL ELEMENT AND METHOD OF FORMING THEREOF

CROSS-REFERENCE TO RELATED APPLICATION

This application is a national phase application of PCT/SG2019/050213, filed on Apr. 15, 2019, which claims the benefit of priority of Singapore Patent Application No. 10201803137R, filed 13 Apr. 2018, the content of which being hereby incorporated by reference in its entirety for all purposes.

TECHNICAL FIELD

The present invention generally relates to a holographic optical element, a method of forming thereof, and an article having optical security incorporated therein.

BACKGROUND

Optical security elements (e.g., optical security devices) are valuable tools in data encryption and document authentication as they exploit various properties of light, including amplitude, phase, polarisation, and wavelength, to create distinctive visual effects that can be difficult to decode or duplicate. Two archetypal optical security devices are microscopic colour prints and holograms. Microscopic colour images may be directly viewed under a magnifying glass, whereas holograms may be easily verified by using a laser pointer to project an image onto a screen placed in the far field (Fraunhofer regime). To strengthen the security of these basic devices, additional complexity may be introduced by encoding multiple sets of information into a single device, i.e., multiplexing.

For example, multiplexed colour prints have been created by encoding information in two independent dimensions of elongated metal nanostructures, allowing for two different images to be read out under orthogonal polarisations of light. Using similar nanostructures of various sizes optimised to respond to different wavelengths, three-colour multiplexed holograms based on the Pancharatnam-Berry (PB) geometric phase have also been demonstrated. Multiplexed PB holograms have also been fabricated using an alternative geometry of nanoslits in a metal film. Unfortunately, transmission PB holograms often suffer from low transmission efficiency due to their use of lossy metal nanostructures and are complicated to read out, which may require the use of circularly polarised light as well as specific illumination and/or viewing angles. Additionally, the nanostructures are fabricated with electron beam lithography or focused ion beam milling, which incurs high costs and imposes practical constraints on the patternable area. These shortcomings, namely low transmission efficiency, complexity of readout, and high fabrication costs, have limited their practical application in optical security devices thus far.

SUMMARY

According to a first aspect of the present invention, there is provided a holographic optical element including:
a hologram portion including a plurality of groups of unit regions, each group of unit regions of the hologram portion being configured to produce a respective holographic image under a respective light illumination having a respective predetermined wavelength; and
a colour filter portion formed on the hologram portion, the colour filter portion including a plurality of groups of unit regions, each group of unit regions of the colour filter portion being arranged on a corresponding group of the plurality of groups of unit regions of the hologram portion,
wherein the plurality of groups of unit regions of the colour filter portion is spatially arranged to form a predetermined colour image.

According to a second aspect of the present invention, there is provided a method of forming a holographic optical element, the method including:
forming a hologram portion including a plurality of groups of unit regions, each group of unit regions of the hologram portion being configured to produce a respective holographic image under a respective light illumination having a respective predetermined wavelength; and
forming a colour filter portion on the hologram portion, the colour filter portion including a plurality of groups of unit regions, each group of unit regions of the colour filter portion being arranged on a corresponding group of the plurality of groups of unit regions of the hologram portion,
wherein the above-mentioned forming the colour filter portion includes spatially arranging the plurality of groups of unit regions of the colour filter portion to form a predetermined colour image.

According to a third aspect of the present invention, there is provided an article having optical security incorporated therein, the article including:
a substrate; and
one or more holographic optical elements according to the first aspect of the present invention formed on the substrate for providing the optical security.

BRIEF DESCRIPTION OF THE DRAWINGS

Embodiments of the present invention will be better understood and readily apparent to one of ordinary skill in the art from the following written description, by way of example only, and in conjunction with the drawings, in which:

FIGS. 5A to 5E depict an example structure and example characteristics of an exemplary holographic colour pixel, according to various example embodiments of the present invention;

FIG. 12 depicts a table showing exemplary dimensions of pillars and the thickness-averaged RGB transmittances of the colour filters in the Perfume print shown in FIG. 7A, according to various example embodiments of the present invention;

FIG. 13 depicts a table showing the RGB wavelength selectivity of the colour filters in the Perfume print shown in FIG. 7A, according to various example embodiments of the present invention;

FIG. 21 depicts a table showing the efficiency of the exemplary QR code print, according to various example embodiments of the present invention;

FIGS. 22A to 22C illustrate the effect of pixel arrangement on multiplexed holograms, according to various example embodiments of the present invention.

DETAILED DESCRIPTION

In light of the foregoing, a need exists to provide a holographic optical element, as well as a method of forming thereof, that seek to overcome, or at least ameliorate, one or more of the deficiencies or problems associated with conventional holographic optical elements, such as but not limited to, enhancing optical security and/or providing additional functionality in an effective and/or efficient manner.

Various embodiments of the present invention provide a holographic optical element, a method of forming thereof, and an article having optical security incorporated therein.

Figure 1:
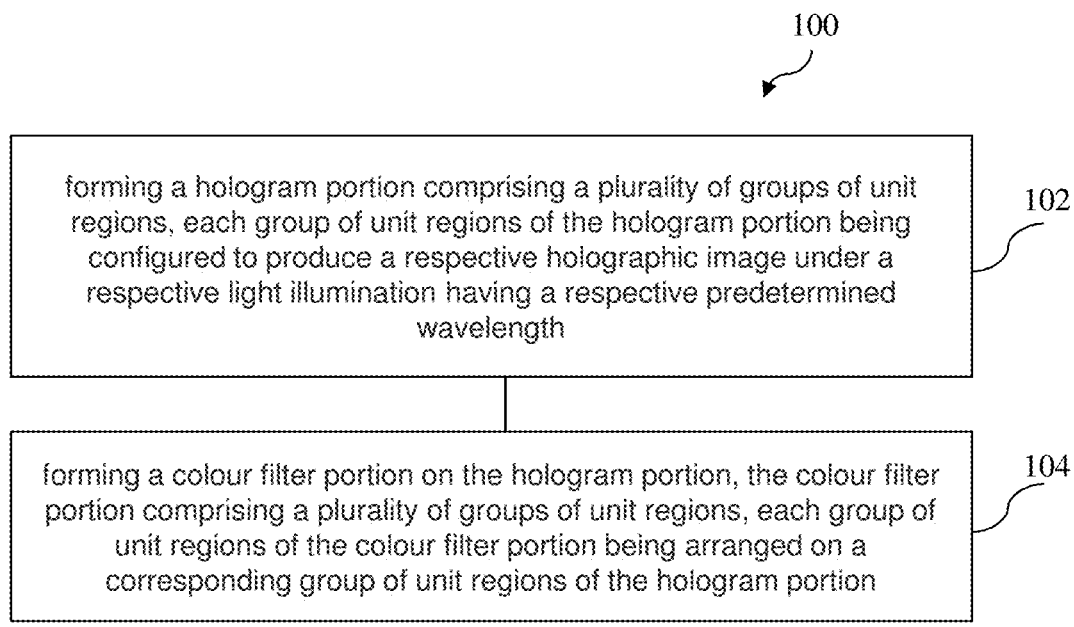
FIG. 1 depicts a schematic flow diagram of a method of forming a holographic optical element, according to various embodiments of the present invention.

FIG. 1 depicts a schematic flow diagram of a method 100 of forming (e.g., fabricating or manufacturing) a holographic optical element according to various embodiments of the present invention. The method 100 includes forming (at 102) a hologram portion including a plurality of groups of unit regions, each group of unit regions (i.e., each group of a plurality of unit regions) of the hologram portion being configured to produce a respective holographic image under a respective light illumination having a respective predetermined wavelength; and forming (at 104) a colour filter portion on the hologram portion, the colour filter portion including a plurality of groups of unit regions, each group of unit regions of the colour filter portion being arranged on a corresponding group of the plurality of groups of unit regions of the hologram portion, whereby the above-mentioned forming (at 104) the colour filter portion includes spatially arranging the plurality of groups of unit regions of the colour filter portion to form a predetermined colour image.

It will be understood by a person skilled in the art that a light illumination having a predetermined wavelength include a light illumination having only the predetermined wavelength or a range of wavelengths including the predetermined wavelength. In other words, a light illumination having a predetermined wavelength is not limited to a light illumination having only the predetermined wavelength.

It will be understood by a person skilled in the art that the holographic optical element may be operable in various orientations and is not limited to any particular orientation(s). By way of an example only and without limitation, in the case of the holographic optical element being positioned in a horizontal orientation, it will be understood by a person skilled in the art the colour filter portion being formed on the hologram portion may be either above (or over) the hologram portion (or on a top side thereof) or below (or under) the hologram portion (or on a bottom side thereof). By way of another example only and without limitation, in the case of the holographic optical element being positioned in a vertical orientation, it will be understood by a person skilled in the art the colour filter portion being formed on the hologram portion may be either to the left of the hologram portion (or on a left side thereof) or to the right of the hologram portion (or on a right side thereof).

In various embodiments, the holographic optical element may be configured as a transmission-type (i.e., a transmission holographic optical element). In various other embodiments, the holographic optical element may be configured as a reflection-type (i.e., a reflection holographic optical element).

In various embodiments, the predetermined colour image may be any colour image desired or predetermined to be formed. In various embodiments, the predetermined colour image may include two or more colours, three or more colours, four or more colours, five or more colours, six or more colours, and so on.

In various embodiments, the colour filter portion is configured to produce the predetermined colour image independent of the different holographic images produced by the hologram portion.

In various embodiments, each unit region of the hologram portion and its corresponding unit region of the colour filter portion (i.e., the unit region of the colour filter portion formed thereon) may form or constitute a pixel (or pixel element or component) of the holographic optical element.

Therefore, the holographic optical element may include a plurality or an array of pixels, each pixel including a unit region of the hologram portion and the corresponding unit region of the colour filter portion formed on the unit region of the hologram portion. In various embodiments, each unit region in the hologram portion and each unit region in the colour filter portion may have the same planar size or dimensions (i.e., same dimensions (e.g., length (x) and width (y)) in a plane of the holographic optical element). In various examples, each unit region in the colour filter portion may have the same square or rectangular planar dimensions. It will be understood by a person skilled in the art that the present invention is not limited to any specific planar size or dimensions of the unit region, as well as shape or tiling thereof, and each unit region may be configured to have a planar size or dimensions as desired or as appropriate based on various factors, such as a desired resolution of the colour image to be formed. In other words, each unit region may have planar dimensions configured based on the desired resolution of the colour image to be formed. By way of example only and without limitation, each unit region may have planar dimensions in a range of 0.5 μm to 10 μm, or preferably 1 μm to 5 μm, or more preferably 2 μm to 3 μm, depending on various factors.

Accordingly, by forming the colour filter portion on the hologram portion such that each group of unit regions of the colour filter portion is arranged on a corresponding group of unit regions of the hologram portion, including spatially arranging (or configuring) the plurality of groups of unit regions of the colour filter portion to form a predetermined colour image, the plurality of groups of unit regions of the colour filter portion may advantageously be configured (e.g., based on their spectral profile) to control passage of the holographic projections (holographic images) by the plurality of groups of unit regions of the hologram portion, while at the same time, form a desired colour image. Therefore, the holographic optical element is not only capable of projecting different holographic projections under different light illuminations (e.g., different laser light), but is also capable of showing a desired colour image (e.g., a QR code, a particular logo or mark, a picture, a drawing or any selected or predetermined colour image), thus advantageously enhancing optical security and/or providing additional functionality in an effective and/or efficient manner.

In various embodiments, the above-mentioned forming (at 104) the colour filter portion further includes interspersing at least one group of the plurality of groups of unit regions amongst one or more other groups (e.g. remaining groups) of the plurality of groups of unit regions. In this regard, such an interspersing amongst the plurality of groups of unit regions may occur when the plurality of groups of unit regions of the colour filter portion is being spatially arranged to form the predetermined colour image, for example, corresponding to the manner in which the plurality of colours (or colour groups) in the predetermined colour image may be interspersed amongst each other.

In various embodiments, controlling passage of the holographic projections includes controlling transmission of the holographic projections in the case of the holographic optical element being a transmission-type (i.e., a transmission holographic optical element) and/or controlling reflection of the holographic projection in the case of the holographic optical element being a reflection-type (i.e., a reflection holographic optical element).

In various embodiments, the above-mentioned forming (at 104) the colour filter portion further includes configuring each group of unit regions of the colour filter portion with wavelength selectivity (e.g., wavelength selectivity of transmission or wavelength selectivity of reflection) for the light illumination associated with the corresponding group of the plurality of groups of unit regions of the hologram portion (i.e., the light illumination having the predetermined wavelength based on which the corresponding group of unit regions of the hologram portion is configured to produce the respective holographic image) and against at least one of one or more light illuminations associated with one or more remaining groups, respectively, of the plurality of groups of unit regions of the hologram portion. As a result, the group of unit regions of the colour filter portion is able to hinder (e.g., minimize, divert, or block) at least one of the light illumination(s) associated with the remaining group(s) of the plurality of groups of unit regions of the hologram portion, thereby minimizing or preventing the holographic image(s) associated with the remaining group(s) of the plurality of groups of unit regions of the hologram portion from being projected when the holographic image associated with the above-mentioned corresponding group of unit regions of the hologram portion is being projected. For example, this advantageously minimizes or prevents a "noisy" holographic image being formed whereby unwanted holographic image(s) (e.g., ghost image(s)), such as from other group(s) of unit regions of the hologram portion, weaken or distract the desired holographic image, such as from the desired group of unit regions of the hologram portion. As a result, different holographic images may be clearly produced by the holographic optical element under different light illuminations having different predetermined wavelengths.

In various embodiments, each group of unit regions of the colour filter portion is configured with wavelength selectivity (e.g., wavelength selectivity of transmission or wavelength selectivity of reflection) for the light illumination associated with the corresponding group of the plurality of groups of unit regions of the hologram portion and against each of the one or more light illuminations associated with the one or more remaining groups, respectively, of the plurality of groups of unit regions of the hologram portion.

In various embodiments, the plurality of groups of unit regions of the colour filter portion are spatially arranged to form the colour image under a light illumination, such as a spatially coherent or incoherent light illumination, a broadband light illumination or a white light illumination.

In various embodiments, the above-mentioned forming (at 102) the hologram portion further includes: spatially arranging (e.g., configuring) the plurality of groups of unit regions of the hologram portion to correspond to the spatial arrangement of the plurality of groups of unit regions of the colour filter portion forming the predetermined colour image; and configuring each group of the plurality of groups of unit regions of the hologram portion to produce the respective holographic image based on the spatial arrangement of the group of unit regions of the hologram portion.

In various embodiments, the above-mentioned forming (at 102) the hologram portion further includes: configuring respectively each unit region of the group of unit regions of the hologram portion to have a thickness for modifying a phase of the light illumination associated therewith (e.g., when transmitted therethrough or reflected therefrom) such that the group of unit regions of the hologram portion collectively produce the respective holographic image under the light illumination associated therewith (i.e., the light illumination having the predetermined wavelength based on which the above-mentioned group of unit regions of the hologram portion is configured to produce the respective holographic image).

In various embodiments, the thickness of the hologram portion is in a range of about 0.6 μm to about 1.8 μm. For example, such a thickness range has been found to be preferred or optimal in the case of the holographic optical element being a transmission holographic print, as will be described later below according to various example embodiments of the present invention. In various embodiments, the range of thickness variation (i.e. the difference between the minimum and maximum thickness) may be a range from 0.1 μm to 10 μm, depending on various factors.

In various embodiments, the above-mentioned forming (at 104) the colour filter portion further includes: configuring respectively each unit region of the group of unit regions of the colour filter portion to have a spectral profile for allowing passage of the light illumination associated with the corresponding group of the plurality of groups of unit regions of the hologram portion and for hindering passage of each of the one or more light illuminations associated with the one or more remaining groups, respectively, of the plurality of groups of unit regions of the hologram portion. In this regard, the above-mentioned configuring a group of unit regions with wavelength selectivity for a light illumination and against each of one or more other light illuminations may include configuring each unit region of the group of unit regions of the colour filter portion to have a spectral profile for allowing passage of the light illumination (having a predetermined wavelength) and for hindering passage of each of the one or more other light illuminations (having different predetermined wavelengths, respectively).

In various embodiments, configuring a unit region of the colour filter portion to have a spectral profile for allowing passage of the light illumination having a predetermined wavelength may include configuring the unit region to have a spectral profile that allows passage of at least 10% of the light illumination having the predetermined wavelength. In various embodiments, the spectral profile may be configured to allow at least 20%, at least 40%, at least 60%, at least 80% or 100% of the light illumination having the predetermined wavelength.

In various embodiments, configuring a unit region of the colour filter portion to have a spectral profile for hindering passage of the light illumination having a predetermined wavelength may include configuring the unit region to have a spectral profile that hinders passage of at least 50% of the light illumination having the predetermined wavelength. In various embodiments, the spectral profile may be configured to hinder at least 60%, at least 70%, at least 80%, at least 90% or 100% of the light illumination having the predetermined wavelength. It will be understood to a person skilled in the art that the unit region may be configured to have a spectral profile that achieves any combination of the above-mentioned passage allowance percentage or percentage range and the above-mentioned passage hindrance percentage or percentage range, as desired or as appropriate.

In addition, it will be appreciated by a person skilled in the art that for a given spectral profile of a colour filter, the wavelength(s) of allowance and the wavelength(s) of hindrance are different, and thus for example the percentage (or percentage range) of light passage at the various wavelengths of interest need not (and in practice may not) sum to 100%. For example, it will be appreciated by a person skilled in the art that the relative percentage of light passage (e.g., wavelength selectivity), instead of solely the absolute percentage, may be of interest as it may be the relative strength of the desired and unwanted (crosstalk) holographic images that determines how noisy the resultant projected holographic images appear. By way of an example only and without limitation, referring to FIG. 6B (which will be described later below), the wavelength selectivity for red light may be the ratio of the red light transmittance of the yellow colour filter over that of the blue colour filter. In this regard, a larger ratio may be better, and mathematically the ratio may be more strongly improved by decreasing the red transmittance of the blue filter than by increasing the red transmittance of the yellow filter. In other words, maximally hindering the passage of unwanted light illumination may be more important than maximally allowing the passage of desired light illumination.

As a further example, consider a hypothetical extreme case in which the colour filters have a perfect hindrance of 100% at unwanted wavelengths, and as a result there is no crosstalk from unwanted holographic images. Then as long as even a small amount of light is able to pass at the desired wavelengths (e.g., 1% light passage allowance), the optical element may have infinite wavelength selectivity and may give excellent performance with low noise. Note also that the low light passage allowance may be compensated by using high power light illumination. On the other hand, consider a case in which the colour filters have a light passage hindrance of 50% at unwanted wavelengths, and as a result there may be relatively strong crosstalk from unwanted holographic images. In this case, even with a perfect 100% light passage allowance at the desired wavelengths, the desired holographic images may be at most twice as strong as the unwanted holographic images (i.e., wavelength selectivity of 2), which may impose a limit on the performance of the holographic optical element. In this regard, changing the light illumination power may not help as it does not affect the relative strength of the holographic images.

Accordingly, in the context of holographic optical elements according to various example embodiments, it may be reasonable for colour filters with even a small light passage allowance at their desired wavelength(s) (by way of an example only and without limitation, 10%) to produce a satisfactory outcome if the light passage hindrance of the unwanted wavelength(s) is sufficiently complete (by way of an example only and without limitation, 98%, i.e., a light passage allowance of 2%). For example, in the case of 10% desired passage vs 2% unwanted passage, the unwanted holographic images would be 5 times weaker than the desired holographic image, leaving the desired holographic image relatively undisturbed.

Accordingly, each group of unit regions of the colour filter portion may be configured with wavelength selectivity for a desired light illumination and against other undesired light illumination(s) based on various factors as described above, such as in a manner for sufficiently achieving minimal or zero (or non-observable) crosstalk from unwanted holographic images. In various embodiments, the wavelength selectivity may have a ratio of passage at selected wavelength(s) over other selected wavelength(s) (e.g., desired wavelength(s) over unwanted/undesired wavelength(s)) of 2 or more, or preferably 3 or more, 4 or more, 5 or more, 7 or more, 10 or more and so on. For better understanding, by way of examples only and without limitation, example wavelength selectivity ratios will be described later below with reference to FIG. 13, according to various example embodiments.

In various embodiments, the above-mentioned forming (at 104) the colour filter portion further includes forming each unit region of the group of unit regions of the colour filter to include an array of pillar structures (or elongated or protruding structures).

In various embodiments, the hologram portion and the colour filter portion are made of a dielectric material.

In various embodiments, the hologram portion and the colour filter portion are formed as a monolithic structure, for example, an integrated structure made from a single material.

In various embodiments, the light illuminations associated with the plurality of groups of unit regions of the hologram portion, respectively, are laser illuminations (or laser light) and are different from each other (e.g., each being selected from a different non-overlapping wavelength or range of wavelengths (or wavelength band).

In various embodiments, the laser illuminations associated with the plurality of groups of unit regions of the hologram portion are each selected from a group consisting of a red laser illumination (e.g., 600 nm to 700 nm), a green laser illumination (e.g., 500 nm to 600 nm) and a blue laser illumination (e.g., 400 nm to 500 nm).

In various embodiments, the light illuminations may have a wavelength (or range of wavelengths) outside the visible spectrum (non-visible light spectrum), such as infrared radiation (IR) (or infrared light) (e.g., 700 nm to 900 nm) and ultraviolet (UV) light (e.g., 200 nm to 400 nm).

In various embodiments, each laser illumination may be selected from a visible spectrum and non-visible light spectrum, such as those mentioned above. In various embodiments, the choice or selection of colours may be determined based on the choice or selection of materials and/or geometry of the colour filter.

Figure 2A:
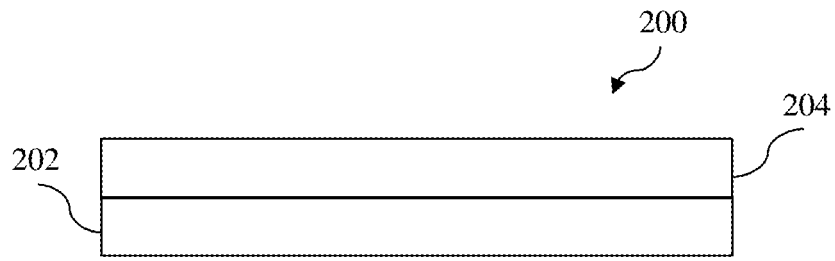
FIGS. 2A and 2B depict schematic drawings of a holographic optical element, according to various embodiments of the present invention.
Figure 2B:
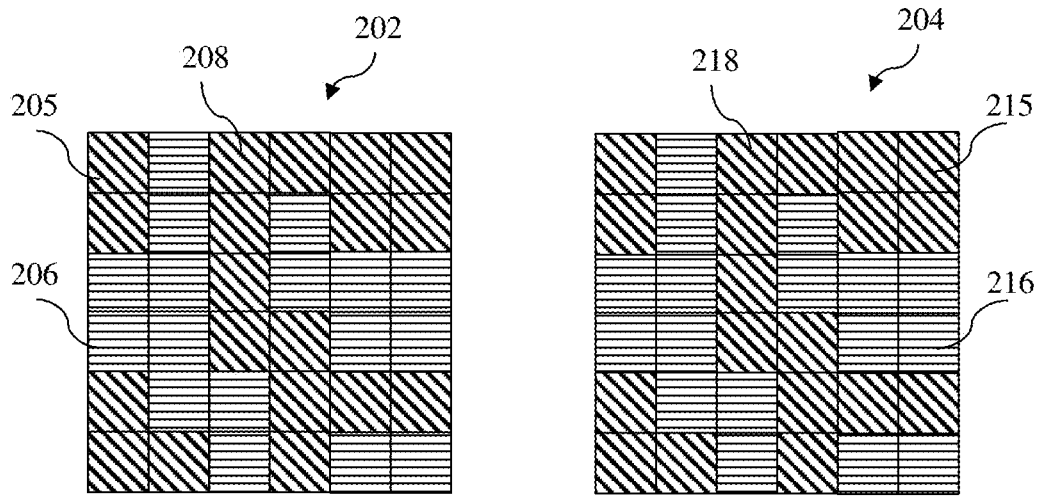

FIG. 2A depicts a schematic drawing of a side view of a holographic optical element 200 according to various embodiments of the present invention, and FIG. 2B depicts schematic drawings of a top view of a hologram portion 202 and a colour filter portion 204. The holographic optical element 200 includes: a hologram portion 202 including a plurality of groups 205/206 of unit regions 208, each group 205/206 of unit regions 208 of the hologram portion 202 being configured to produce a respective holographic image (not shown in FIGS. 2A and 2B) under a respective light illumination having a respective predetermined wavelength; and a colour filter portion 204 formed on the hologram portion 202, the colour filter portion 204 including a plurality of groups 215/216 of unit regions 218, each group 215/216 of unit regions 218 of the colour filter portion 204 being arranged on a corresponding group 205/206 of unit regions 208 of the hologram portion 202, whereby the plurality of groups of unit regions of the colour filter portion is spatially arranged to form a predetermined colour image.

In FIG. 2A, for illustration purposes only and without limitation, the hologram portion 202 and the colour filter portion 204 are shown as two layers. However, it will be understood by a person skilled in the art that the hologram portion 202 and the colour filter portion 204 may not be separate layers, and may together form a monolithic structure, for example, an integrated structure made from a single material, as described herein according to various embodiments.

In FIG. 2B, for illustration purposes only and without limitation, unit regions belonging to a particular group of unit regions are denoted by the same pattern or shading. For example, in FIG. 2B, the hologram portion 202 includes a first group 205 of unit regions denoted by the same diagonal stripe pattern, and a second group 206 of unit regions denoted by the same horizontal stripe pattern. Similarly, the colour filter portion 204 includes a first group 215 of unit regions denoted by the same diagonal stripe pattern, and a second group 216 of unit regions denoted by the same horizontal stripe pattern. Furthermore, corresponding groups of unit regions of the hologram portion 202 and the colour filter portion 204 are also denoted by the same pattern. It will be appreciated by a person skilled in the art that the present invention is not limited to the number of unit regions or number of groups of unit regions (or the size of the hologram portion 202 and/or the colour filter portion 204) as shown in FIG. 2B, and any number of unit regions or number of groups of unit regions may be provided or formed as desired or as appropriate depending on various factors, such as the size of the colour image desired to be formed. It will also be appreciated by a person skilled in the art that the configuration (or arrangement) of the groups of unit regions shown in FIG. 2B is simply an arbitrary configuration for illustration purposes only and the present invention is not limited thereto. The groups of unit regions may be configured (or arranged) as desired or as appropriate based on various factors, such as the colour image and/or the holographic images desired to be formed. Exemplary methods for configuring the groups of unit regions of the hologram portion 202 and the colour filter portion 204 will be described later according to various example embodiments of the present invention.

In various embodiments, the holographic optical element 200 corresponds to the holographic optical element formed by the method 100 as described hereinbefore with reference to FIG. 1, therefore, various features of the holographic optical element 200 may correspond to (e.g., the same as) those of the holographic optical element formed by the method 100 according to various embodiments, and thus need not be repeated with respect to the holographic optical element 200 shown in FIGS. 2A and 2B for clarity and conciseness. In other words, various embodiments described herein in context of the method 100 as shown in FIG. 1 are analogously valid for the holographic optical element 200 shown in FIGS. 2A and 2B, and vice versa.

Figure 3:
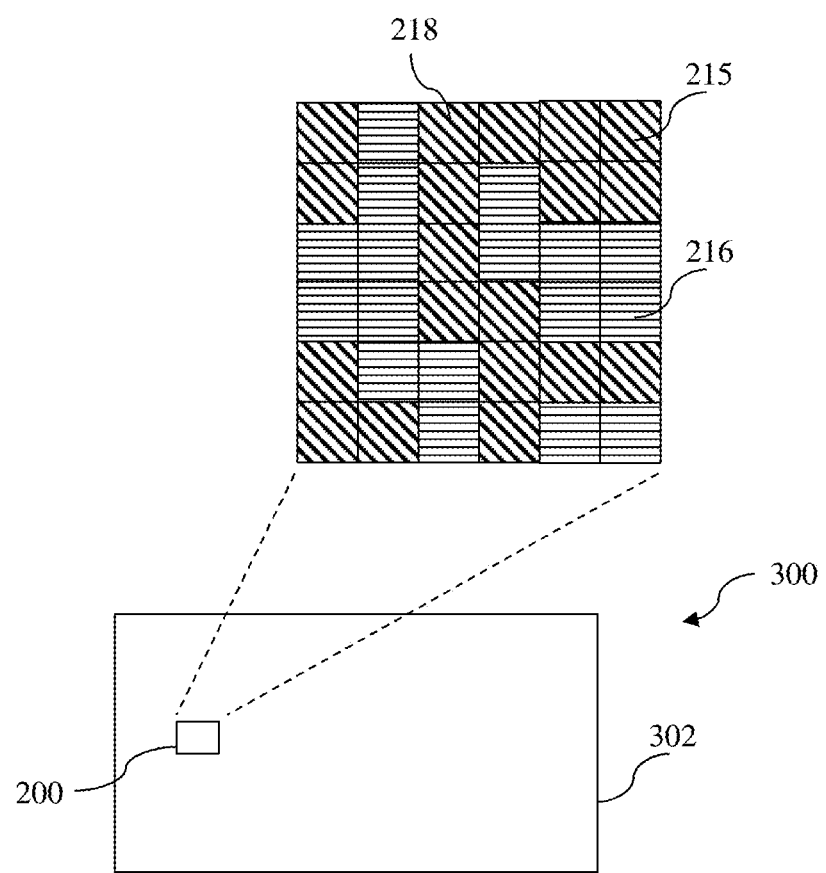
FIG. 3 depicts a schematic drawing of a top view of an article having optical security incorporated therein, according to various embodiments of the present invention.

FIG. 3 depicts a schematic drawing of a top view of an article 300 having optical security incorporated therein (e.g., embedded therein, attached thereto or applied thereto), according to various embodiments of the present invention. The article 300 includes a substrate 302 and one or more holographic optical elements 200 as described herein according to various embodiments, such as with reference to FIG. 1, 2A or 2B. It will be appreciated by a person skilled in the art that any number of holographic optical elements 200 may be incorporated in any article of the interest desired to have optical security (e.g., for anti-counterfeiting protection), for example, various items and/or documents, such as but not limited to, smart cards, banknotes, security documents (e.g., identity card or passport), certificates, luxury or high-value consumer products and so on.

It will be appreciated by a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "includes" and/or "including," or the like (e.g., "includes" and/or "including") when used in this specification, specify the presence of stated features, integers, steps, operations, elements, and/or components, but do not preclude the presence or addition of one or more other features, integers, steps, operations, elements, components, and/or groups thereof.

In order that the present invention may be readily understood and put into practical effect, various example embodiments of the present inventions will be described hereinafter by way of examples only and not limitations. It will be appreciated by a person skilled in the art that the present invention may, however, be embodied in various different forms and should not be construed as limited to the example embodiments set forth hereinafter. Rather, these example embodiments are provided so that this disclosure will be thorough and complete, and will fully convey the scope of the present invention to those skilled in the art.

In particular, for better understanding of the present invention and without limitation or loss of generality, various example embodiments of the present invention will now be described with respect to a holographic optical element being in the form of a transmission holographic colour print (or more specifically, a transmission multiplexed holographic colour print, or may also simply be referred to as a "print" herein) for optical security.

Conventional optical security devices provide authentication by manipulating a specific property of light to produce a distinctive optical signature. For instance, microscopic colour prints modulate the amplitude, whereas holograms typically modulate the phase of light. However, their relatively simple structure and behaviour may be easily imitated. In this regard, various example embodiments provide a pixel that overlays a structural colour element (e.g., corresponding to the "unit region" of the colour filter portion as described herein according to various embodiments) onto a phase plate (e.g., corresponding to the "unit region" of the hologram portion as described herein according to various embodiments) to control both the phase and amplitude of light, and arrays these pixels into a monolithic print that exhibits complex behaviour. In this manner, the fabricated holographic colour print according to various example embodiments appears as a colour image under white light, while projecting up to, for example, three different holograms under, for example, red, green and blue laser illuminations, respectively. The holographic colour print can be readily verified but challenging to emulate, and can provide enhanced security in anti-counterfeiting applications. In various example embodiments, as the holographic colour print encodes information only in the surface relief of a single polymeric material, nanoscale 3D printing of customised masters may enable their mass-manufacture by nanoimprint lithography.

As described in the background, optical security elements (e.g., optical security devices) are valuable tools in data encryption and document authentication as they exploit various properties of light, including amplitude, phase, polarisation, and wavelength, to create distinctive visual effects that can be difficult to decode or duplicate. Two archetypal optical security devices are microscopic colour prints and holograms. Microscopic colour images may be directly viewed under a magnifying glass, whereas holograms may be easily verified by using a laser pointer to project an image onto a screen placed in the far field (Fraunhofer regime). To strengthen the security of these basic devices, additional complexity may be introduced by encoding multiple sets of information into a single device, i.e., multiplexing.

For example, multiplexed colour prints have been created by encoding information in two independent dimensions of elongated metal nanostructures, allowing for two different images to be read out under orthogonal polarisations of light. Using similar nanostructures of various sizes optimised to respond to different wavelengths, three-colour multiplexed holograms based on the Pancharatnam-Berry (PB) geometric phase have also been demonstrated. Multiplexed PB holograms have also been fabricated using an alternative geometry of nanoslits in a metal film. Unfortunately, transmission PB holograms often suffer from low transmission efficiency due to their use of lossy metal nanostructures and are complicated to read out, which may require the use of circularly polarised light as well as specific illumination and/or viewing angles. Additionally, the nanostructures are fabricated with electron beam lithography or focused ion beam milling, which incurs high costs and imposes practical constraints on the patternable area. These shortcomings, namely low transmission efficiency, complexity of readout, and high fabrication costs, have limited their practical application in optical security devices thus far.

Various example embodiments note that, in comparison, traditional phase elements including dielectric structures of different thicknesses (phase plates) enable holographic projection to be achieved with higher transmission efficiency, simpler illumination methods (e.g. a handheld laser pointer), and little restriction on the polarisation or incidence angle of the light. They are also potentially easier and cheaper to manufacture than PB nanostructures as their larger dimensions are within the resolution limit of photolithography. High transmission efficiency multiplexed holograms that project up to three different images depending on the incident wavelength have previously been demonstrated using a variety of techniques including phase modulation and depth division. Recently, white-light transmission colour holograms operating in the Fresnel limit have also been developed.

However, various example embodiments note that as phase holograms conventionally are not designed to control the amplitude of light, they generally appear random or featureless under incoherent illumination, which make them less attractive or less suitable as optical security devices. Conversely, colour images have superior decorative values on banknotes or documents but generally do not produce any meaningful holographic projection under coherent illumination as they generally do not control the phase of the light. In this regard, various example embodiments identified that introducing a design methodology to control the phase and amplitude of light simultaneously is an area that has been relatively unexplored and may enable the creation of a dual-function device that appears as an image in plain view, but encrypts additional data that can be retrieved through holographic projection. In various example embodiments, such an encryption refers to the fact that the holographic information cannot be read except by illumination with coherent monochromatic light of a suitable wavelength, noting that the introduction of one or more additional phase masks as security keys may enable even more secure encryption.

Accordingly, various example embodiments provide an optical security element (e.g., optical security device) that combines phase and amplitude control to integrate holograms (i.e., multiple holograms) into a colour print, which may herein be referred to as a "holographic colour print" (or more specifically, a "multiplexed holographic colour print", or may also simply be referred to as a "print"). For example, the optical security device may appear as a colour image when viewed in white light, but may reveal up to, for example, three different hidden grayscale holographic projections under, for example, red, green, and blue laser illuminations, respectively. Accordingly, in various example embodiments, the multiple holograms are advantageously encrypted into a colour print. Integrating multiple holograms into a colour print may require the ability to encode both phase and colour independently within individual pixel elements, which for example is a challenge for recent PB holograms. The holographic colour print according to various example embodiments provides a unique and easily recognisable visual effect, and may be applied in, for example, the security industry as effective anti-counterfeiting elements that provide enhanced optical security on important documents, such as identity cards and passports.

Figure 4:
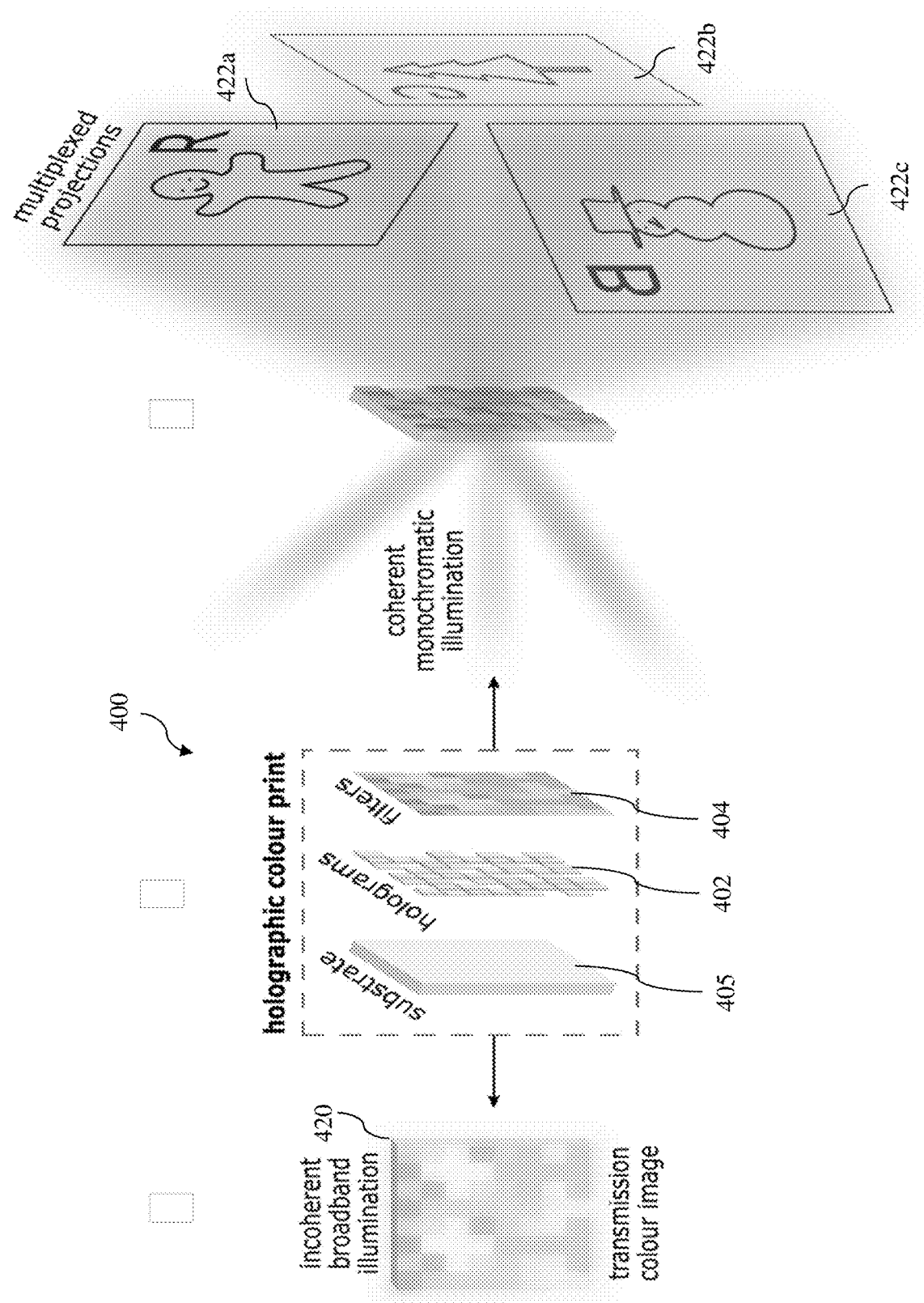
FIG. 4 depicts an exemplary holographic colour print, along with its colour image and various holographic projections, according to various example embodiments of the present invention.

FIG. 4 depicts an exemplary holographic colour print 400, along with its colour image 420 and various holographic projections 422a, 422b, 422c, according to various example embodiments of the present invention. In particular, FIG. 4 depicts an exploded-view schematic of the holographic colour print 400 in the form of a layered optical device in which colour filters 404 are integrated on top of holograms 402. The colour filters 404 may act as colour pixels in a colour image 420 under white light illumination, such as from a lamp or torch, and also serve to control the transmission of red, green and blue (RGB) laser light through the pixels of the underlying multiplexed holograms 402, as illustrated in FIG. 4. For example, under RGB laser illumination, each wavelength of light may select a different holographic projection 422a, 422b, 422c (e.g., corresponding to the "respective holographic image" described herein according to various embodiments), which is independent of the colour image 420 and the other projections. Far field projections appear along the axis of laser illumination. In FIG. 4, three different angles of incidence are shown to illustrate the three distinct holographic projections. The projections remain in focus at any distance in the far field, can be achieved over a wide range of incident angles, and are perfectly overlapped under collinear multi-colour illumination.

Accordingly, a working or operating example of a transmissive holographic colour print 400 is illustrated in FIG. 4. The holographic colour print 400 may include a top layer (or a first layer) 404 (e.g., corresponding to the "colour filter portion" described herein according to various embodiments) including colour filters that encode a colour print, and a bottom layer (or a second layer) 402 (e.g., corresponding to the "hologram portion" described herein according to various embodiments) including phase plates that encode the holograms. The colour filters 404 may be configured to have two functions: (1) to collectively form a colour image 420 under white light illumination, and (2) to control the transmission of red, green and blue (RGB) laser light through the pixels of the underlying multiplexed holograms. With coherent monochromatic illumination (e.g. light from a laser pointer), the incident light may be filtered such that only the relevant phase plates with colour filters that closely match the illumination wavelength are selected for a given holographic projection, whereas the other phase plates do not form a projection as their colour filters are mismatched and reject the incident light. Therefore, the multiplexed holographic colour print 400 is operable to show different holographic projections 422a, 422b, 422c when illuminated by red, green and blue lasers, respectively.

Accordingly, because incident light passes through all pixels in parallel, the pixels may act independently to allow transmission of different wavelengths in some regions of space (e.g., a group of pixels of the holographic colour print 400 corresponding a group of unit regions of the hologram portion 402 configured to produce a particular holographic image) but not others (e.g., other group(s) of pixels of the holographic colour print 400 corresponding to other group(s) of unit regions of the hologram portion 402 configured to produce other holographic image(s)), which enables several holograms to jointly occupy the total area available of the holographic colour print 400 based on a spatial multiplexing technique. Using the freedom to divide the space into regions of arbitrary shapes and sizes (e.g., various groups of pixels of the holographic colour print 400 forming various shapes and sizes), the individual hologram areas (e.g., the plurality of groups of unit regions of the hologram portion 402) may then be strategically allocated or configured such that the corresponding arrangement of the colour filters additionally encodes a chosen or desired colour image 420. Under incoherent white light illumination (e.g., light from a lamp or torch), the phase modulation of the holograms may be effectively ignored and the colour filters may act as amplitude-modulating colour pixels that together show the desired colour image 420.

Exemplary design(s)/configuration(s) of a holographic colour pixel will now be described according various example embodiments of the present invention.

In various example embodiments, to create a physical realisation of a holographic colour print, a holographic colour pixel may first be formed or developed that controls both the phase and amplitude of light. In various example embodiments, the pixel may have a relatively large minimum feature size of several hundreds of nanometres and includes (e.g., entirely made of) a single dielectric material. As a result, the holographic colour print is able to be fabricated using femtosecond 3D printing (direct laser writing) as a monolithic structure in a cross-linked polymer. For illustration purposes, an example fabrication process will be described later below according to various example embodiments of the present invention.

FIGS. 5A to 5E depicts an example structure and example characteristics of an exemplary holographic colour pixel 500 according to various example embodiments of the present invention. In particular, FIG. 5A depicts a schematic drawing of a structure of the holographic colour pixel 500 that is configured to provide combined phase and amplitude control, which includes an array 502 of pillars 506 (e.g., corresponding to "colour filter" described herein) integrated on top of a block 504 (e.g., corresponding to a "phase plate" described herein) made of a dielectric material with refractive index n. The colour filter 502 may be configured to control the amplitude of light based on its transmission spectrum $T(\lambda)=f(h, d, p)$, which depends on the pillar array dimensions, for example, {h, d, p} (height, diameter and pitch). The phase plate 504 may be configured to control the phase of transmitted light where the phase shift arises from path length differences that depend on the block thickness.

FIG. 5B depicts the transmission spectra and corresponding optical micrographs of pillar arrays with red, green and blue colours, respectively. The transmission spectra were averaged from measurements of the pillar arrays with the same dimensions as those shown in FIGS. 5C to 5E, but patterned separately on blocks of uniform thickness (0.6 μm, 1.0 μm, 1.4 μm, 1.8 μm). Good RGB wavelength selectivity can be seen from a high transmittance (average 62%) for red (638 nm), green (527 nm), and blue (449 nm) for light passing through their respective filters (filled circles), and low transmittance (average 15%) for light passing through the wrong filters (empty circles).

FIGS. 5C to 5E depict the false-colour tilt-view SEMS of pillar arrays with dimensions optimised to give the best or optimal selectivity for red, green and blue light, according to various example embodiments of the present invention. By way of an example and without limitations, according to various example embodiments, the pillars (about 0.4 μm in diameter and respectively 1.9 μm, 0.7 μm and 2.6 μm in height) may be patterned in a square array of 1 μm pitch onto 3×3 μm² blocks of randomly varying thickness within a thickness range to be used for hologram phase plates (thickness range of 0.6 μm to 1.8 μm). In FIGS. 5C to 5E, the scale bars each denote 2 μm.

Accordingly, the pixel design or configuration according to various example embodiments integrates a dielectric phase plate 504 under a structural colour element 502 including an array of dielectric pillars 506, which acts as a colour pixel for the transmission colour image under white light illumination and also as a colour filter to selectively transmit red, green, or blue laser light for hologram multiplexing. The colour filters 502 are configured to be diffractive, thereby transmitting the desired wavelengths of light on-axis and rejecting unwanted wavelengths by diffracting them off-axis at large angles (e.g., see FIG. 16, which will be described later below). According to various example embodiments, the dielectric phase plate 504 controls the phase of transmitted light according to the equation $\phi(\lambda) = 2\pi(n-1)t/\lambda$, where the phase shift ($\phi$) arises from path length differences that depend on the phase plate thickness (t) and refractive index (n). The refractive index of the dielectric polymer material used (e.g., between 1.54 and 1.58 in the visible region) according to various example embodiments has been found to allow a full $2\pi$ phase modulation to be achieved for red, green and blue lights by varying the phase plate thickness over a range of 1.2 μm. In various example embodiments, as it may be impractical to fabricate samples with a continuous phase variation, the phase is quantised and a number of discrete thickness steps are defined to span the required or desired 1.2 μm range (e.g., see Section on "Phase Plate Thickness Calibration", which will be described later below).

Assuming that a phase plate acts as an ideal phase-controlling (constant-amplitude) element and a pillar array colour filter acts as an ideal amplitude-controlling (constant-phase) element, various example embodiments combine these elements into a layered pixel for independent phase and amplitude control. In practice, however, various example embodiments identified that due to the refractive index mismatch between the glass substrate and the polymer structures, changing the thickness of the underlying block to control the phase may affected the transmission amplitude of the overall pixel, i.e., phase-amplitude coupling may be present. In this regard, various example embodiments found that the shift in transmission spectrum with block thickness caused a significant change in the pixel colour with thin blocks of t=0 to 0.4 μm, but was not noticeable for thicker blocks of t≥0.6 μm (e.g., see FIGS. 10A to 10C, which will be described later below). As such, various example embodiments configures blocks having a thickness in a range of 0.6 μm to 1.8 μm thickness to span the required range of 1.2 μm.

To minimise any remaining variations in pixel transmission amplitude due to differences in phase plate height, various example embodiments fabricate dielectric pillar arrays on blocks with thicknesses varying between 0.6 to 1.8 μm and measure their transmission spectra $T(\lambda)$. The dependence of $T(\lambda)$ on thickness may then be averaged out, effectively eliminating any residual thickness dependence. Subsequently, the pillar array dimensions of height (h), diameter (d), and pitch (p) may be varied or configured to enable access to a range of colours spanning greater than 50% of the sRGB colour gamut (e.g., see FIGS. 11A and 11B, which will be described later below), from which the most suitable filters for red, green and blue wavelengths may then be selected (e.g., see Section on "Colour Palette and Wavelength Selectivity", which will be described later below). The transmission spectra of the RGB colour filters (e.g., see FIG. 5B) with optimised pillar array dimensions (e.g., see FIGS. 5C to 5E) show a high transmittance averaging 62% at the desired wavelength and a low transmittance averaging 15% at unwanted wavelengths (e.g., see Table 1200 shown in FIG. 12, which will be described later below). These transmittance values afford sufficient wavelength selectivity, i.e., mutually exclusive or orthogonal transmission, at the wavelengths of interest (e.g., see Table 1300 shown in FIG. 13, which will be described later below). For example, the wide colour range enables the ability to choose or select suitable colours to reproduce the colour image under white light illumination, and the good wavelength selectivity ensures that laser light can be filtered to distinguish the individual holograms.

In addition to reducing the effects of pixel phase on pixel amplitude (phase-amplitude coupling), which may otherwise affect multiplexing and colour image formation, various example embodiments further investigated the effect of pixel amplitude on pixel phase (amplitude-phase coupling), which may affect the holographic projections. It was found that the pillar colour filters may add a weak unwanted phase variation on top of the desired phase variation controlled by the phase plate thickness (e.g., see FIGS. 19 and 20, which will be described later below). However, while this extra phase can be compensated for at the pixel level if necessary or desired, it was found that the extra phase was an order of magnitude smaller than the effect of the phase plates (e.g., see Section on "Measuring Amplitude-Phase Coupling", which will be described later below). Accordingly, various example embodiments safely neglect the extra phase in the holographic colour prints.

Exemplary method(s) for fabrication of holographic colour prints will now be described according various example embodiments of the present invention.

Figure 6A:
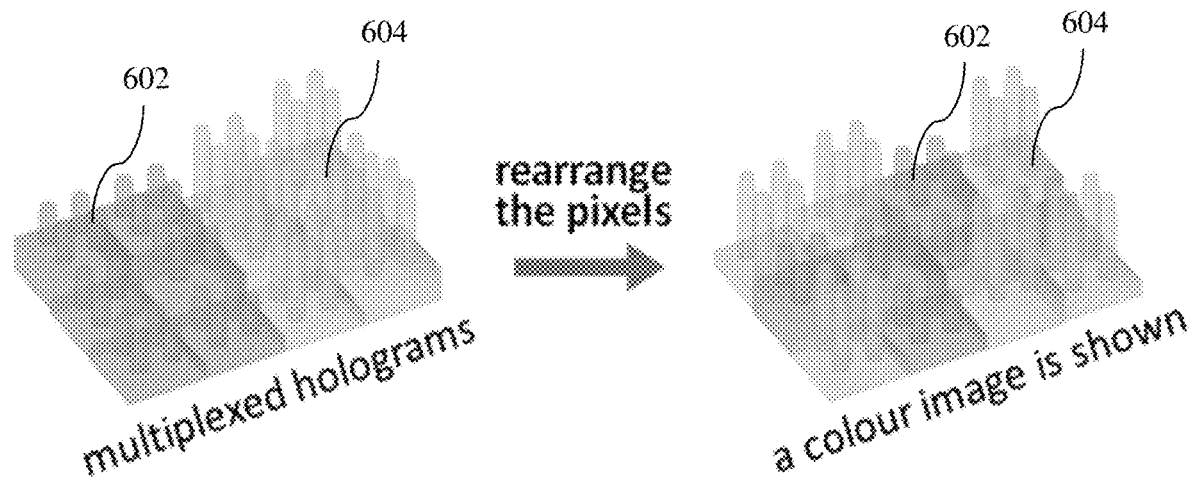
FIGS. 6A to 6H relate to an exemplary two-tone holographic colour print, according to various example embodiments of the present invention.
Figure 6B:
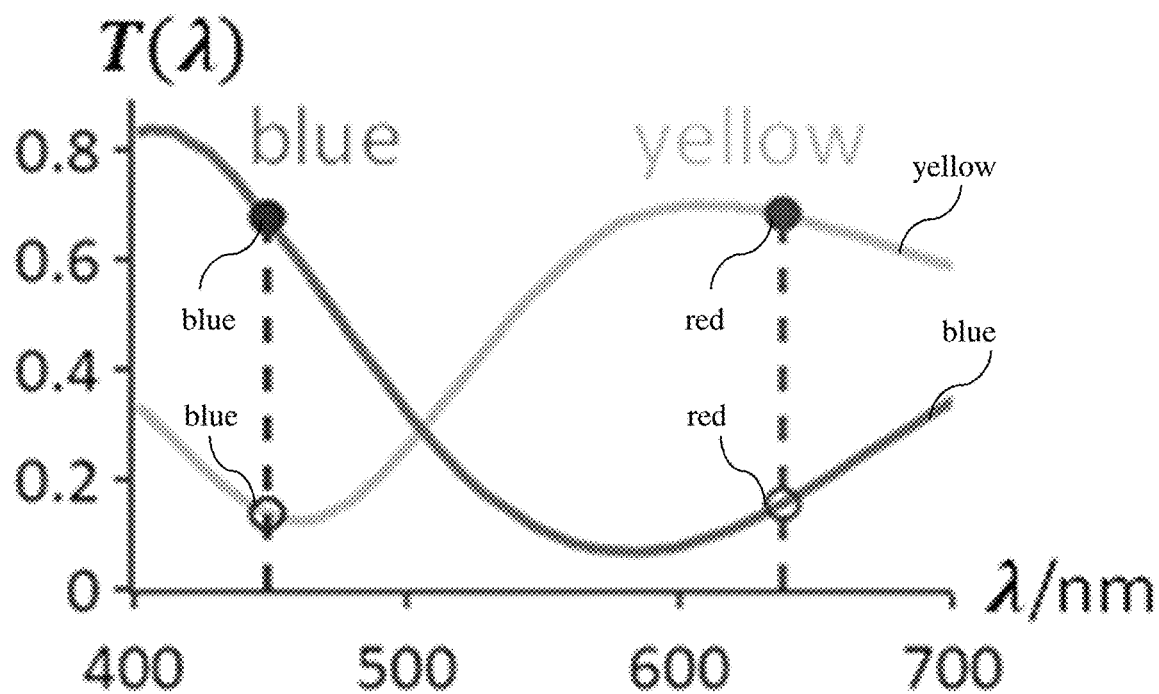
Figure 6C:
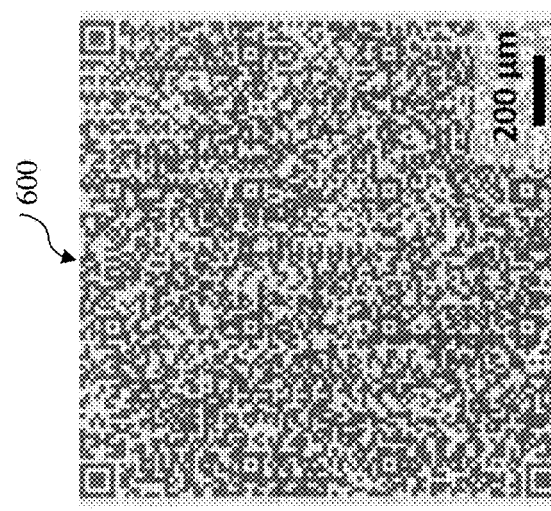
Figure 6D:
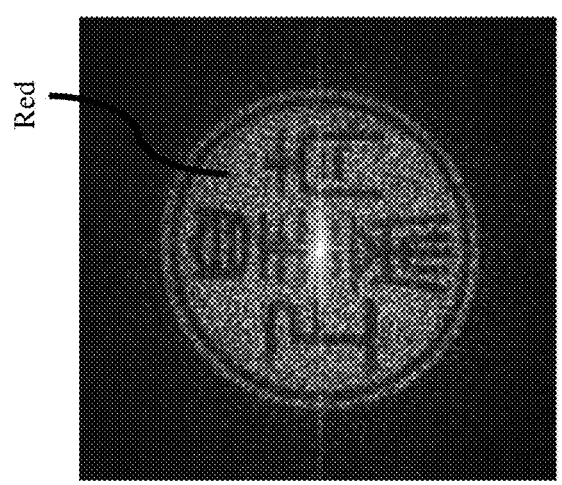
Figure 6E:
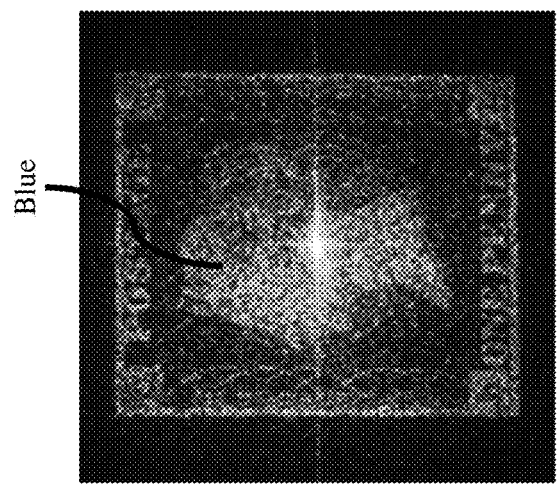
Figure 6F:
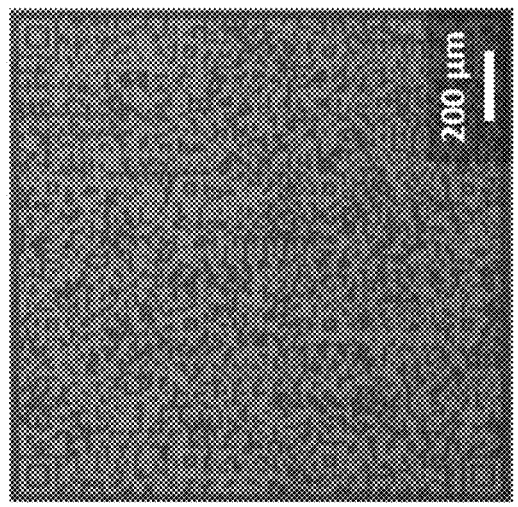
Figure 6G:
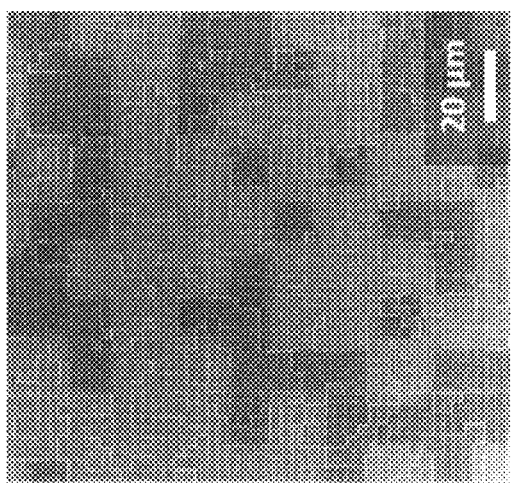
Figure 6H:
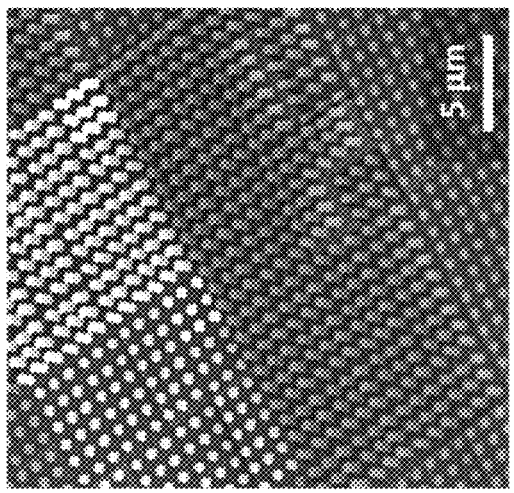

FIGS. 6A to 6H relate to an exemplary two-tone holographic colour print 600 according to various example embodiments of the present invention. FIG. 6A illustrates a design technique for the holographic colour print 600, including the ability to choose the amplitudes of the pixels independent of their phase makes it possible to rearrange the pixels in a multiplexed hologram (spatial freedom) so that the pixel arrangement includes meaningful information as well, allowing a colour image to be shown on top of the holograms. In various example embodiments, as long as the phase is calculated taking the pixel arrangement into account, the individual holographic projections can still be maintained. FIG. 6B depicts a transmission spectra of the yellow and blue colour filters used, which have mutually exclusive (orthogonal) transmission at the wavelengths of interest (638 nm red and 449 nm blue). FIG. 6C depicts an optical characterisation of the holographic colour print 600. In particular, FIG. 6C depicts a transmission optical micrograph of the two-tone multiplexed hologram 600 in which the pixels are arranged to form a 480×480 pixel colour QR code (e.g., 1.44 mm²). The blue colour filters (blue hologram channel) 602 selectively pass blue light but not red light, whereas the yellow colour filters (red hologram channel) 604 selectively pass red light but not blue light. FIGS. 6D and 6E depict holographic projections in transmission, photographed on a white wall in a darkened room. In particular, FIG. 6D depicts an image of a Chinese seal shown under 638 nm red laser illumination and FIG. 6E depicts an image of a Penny Black stamp shown under 449 nm blue laser illumination. The projection size scales with the projection distance, reaching an average size of approximately 10 cm at a distance of 1 m. FIGS. 6F to 6H depict scanning electron micrographs (SEMs) of the holographic colour print 600 at various scales, namely, 200 μm, 20 μm and 5 μm, respectively. Each holographic colour pixel includes a 3×3 pillar array colour filter on top of a 3×3 μm² phase plate, and each QR code pixel is a super-pixel including a 4×4 block of holographic colour pixels. In the close-up tilt-view SEM, a blue and a yellow QR code super-pixel are highlighted in false colour, and the bottom-right corner holographic colour pixel of each is further highlighted.

Accordingly, based on the holographic colour pixel design/configuration as described hereinbefore, various example embodiments are able to create or form multiplexed holograms by fabricating large arrays of pixels. In an example simplest case, holograms may be multiplexed side-by-side with the phase plates of each hologram spatially segregated in contiguous single-coloured regions, giving a similar result to that achievable by pasting macroscopic colour filters onto a spatial light modulator. However, such multiplexing technique cannot be used to realise an arbitrary or desired colour image. In contrast, in the design/configuration of the holographic colour prints according to various example embodiments, the ability to control phase and amplitude on the level of individual pixels enables the freedom to move pixels around as illustrated in FIG. 6A as long as the phase is recalculated for any new pixel arrangement. As the total area allocated to each hologram is not fixed, pixels of one hologram may be replaced with pixels of another hologram as long as each hologram still transmits enough light to give a reasonably high signal-to-noise ratio (e.g., see section on "Balancing Wavelength Selectivity in Multiplexed Holograms", which will be described later below). Having the option to freely rearrange and replace pixels ("spatial freedom") generally provides the ability to choose any arbitrary or desired pixel arrangement. Various example embodiments identified a few factors or exceptions, which will be described later below under section "Pixel Arrangement for Spatial Multiplexing of Holograms". Advantageously, it was found that replacing pixels, rearranging amplitudes, and recalculating the phases does not greatly affect the fidelity of holographic projection when the number of pixels is sufficiently large (e.g. 480×480 pixels, as used in various example embodiments).

For simplicity, the multiplexing of two holograms into a two-tone image 600, being a QR code, is first demonstrated according to various example embodiments. Various example embodiments note that although the holograms in this example are designed for red and blue laser illumination, there is no need for the colour filters used for multiplexing to be red and blue as long as their transmission amplitudes are mutually exclusive (orthogonal) at the design wavelengths. Because the wavelength selectivity requirement constrains the spectra at only two points, there are a number of possible spectra and therefore colours that can be used. As such, there exists some flexibility to choose colour filters with transmission spectra that best match both the desired image colours and the hologram design wavelengths ("spectral freedom"), or that achieve an optimal trade-off between these objectives.

Various example embodiments found that red-and-blue QR codes provided very poor grayscale contrast and were difficult to read. To improve the visibility of the QR code for scanning under broadband white light illumination, the colours yellow (with a high average transmittance of 48% over the range of 450 nm to 650 nm, which includes most of the power of a typical white light source) and blue (low average transmittance of 22%) were selected for the light and dark pixels, respectively. This selection of colours maximises the grayscale image contrast in white light while still retaining wavelength selectivity for the multiplexed holograms under monochromatic red and blue light (e.g., see FIG. 6B).

Having selected suitable colours, exploiting the spatial degree of freedom in the multiplexed holograms allows the ability to arrange the pixels into a print that shows a desired colour image, and in this example, a meaningful binary image of a QR code 600 (see FIG. 6C) without a significant decrease in the fidelity of the holographic projections. The QR code 600 stores a 2,620-bit message at error correction level H which can be retrieved by scanning the image with a mobile phone or other reader. It can be observed that the holographic projection switches cleanly between the Chinese seal (see FIG. 6D) and the Penny Black stamp (see FIG. 6E) under alternating red and blue laser illumination, despite both projections occupying the same region in space (e.g., see FIG. 18, which will be described later below). The print may have a multiscale hierarchical structure (e.g., see FIGS. 6F to 6H) in which pillar array colour filters of different dimensions and hologram phase plates of varying thickness are seamlessly integrated.

Figure 7A:
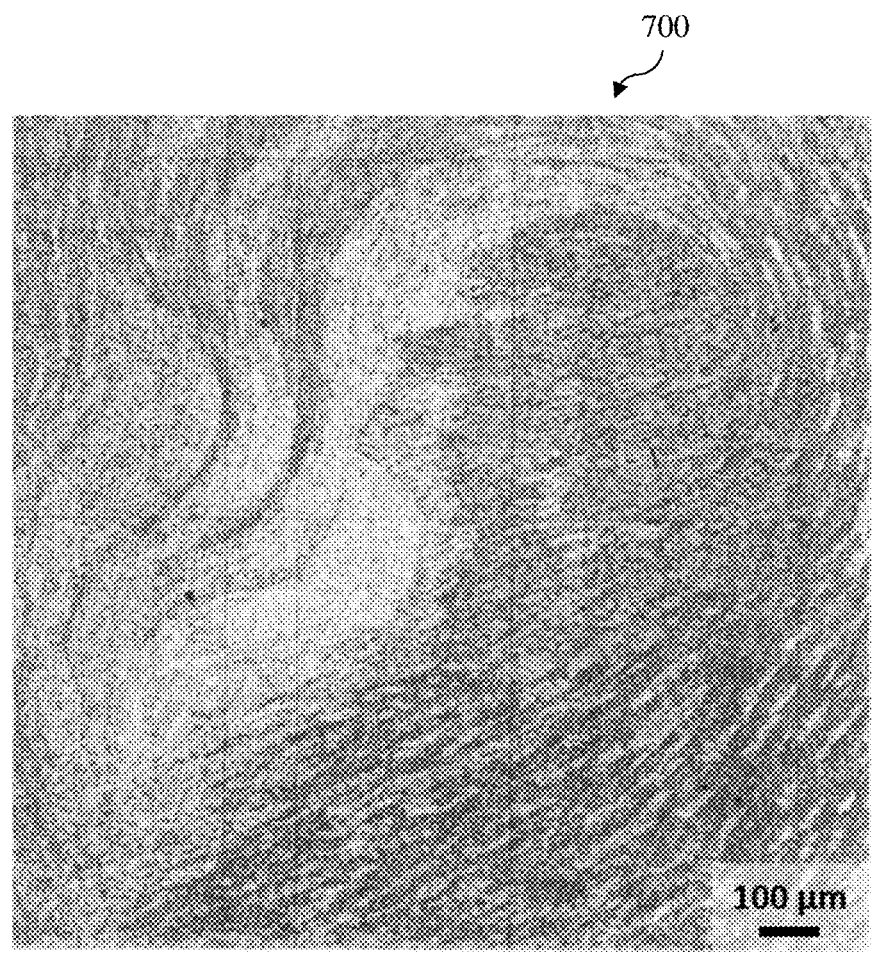
FIGS. 7A to 7F relate to an exemplary six-colour holographic colour print (corresponding to the Perfume print), according to various example embodiments of the present invention.

Using the spectral degree of freedom, the constraint on wavelength selectivity of the colour filters is relaxed according to various example embodiments by introducing three additional colours (orange, yellow, and purple) into a three-colour multiplexed RGB (red, green, and blue) hologram and arranging the pixels to form a complex six-colour image 700 as illustrated in FIG. 7A in greyscale.

Figure 7B:
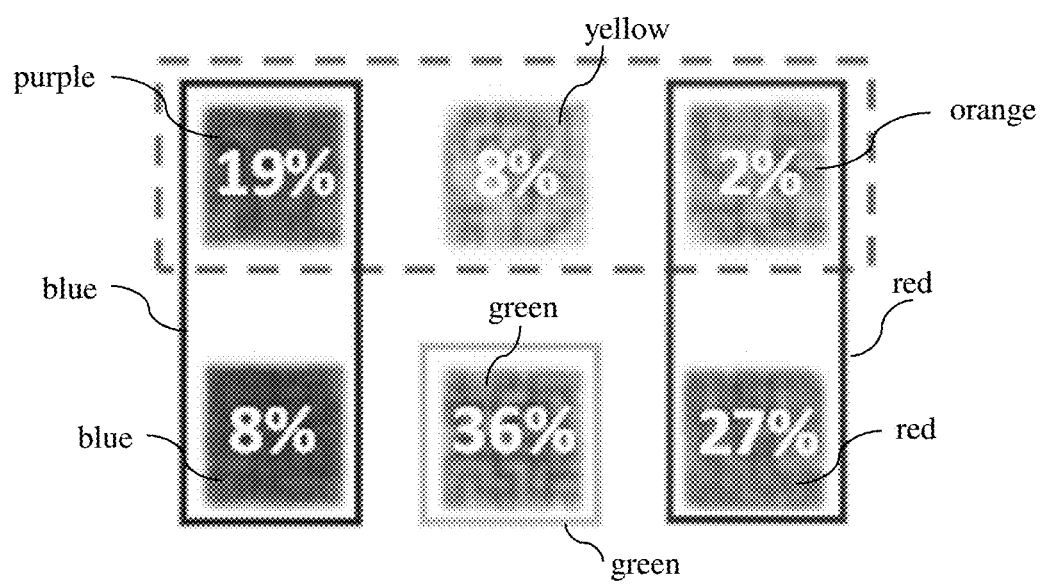
Figure 7C:
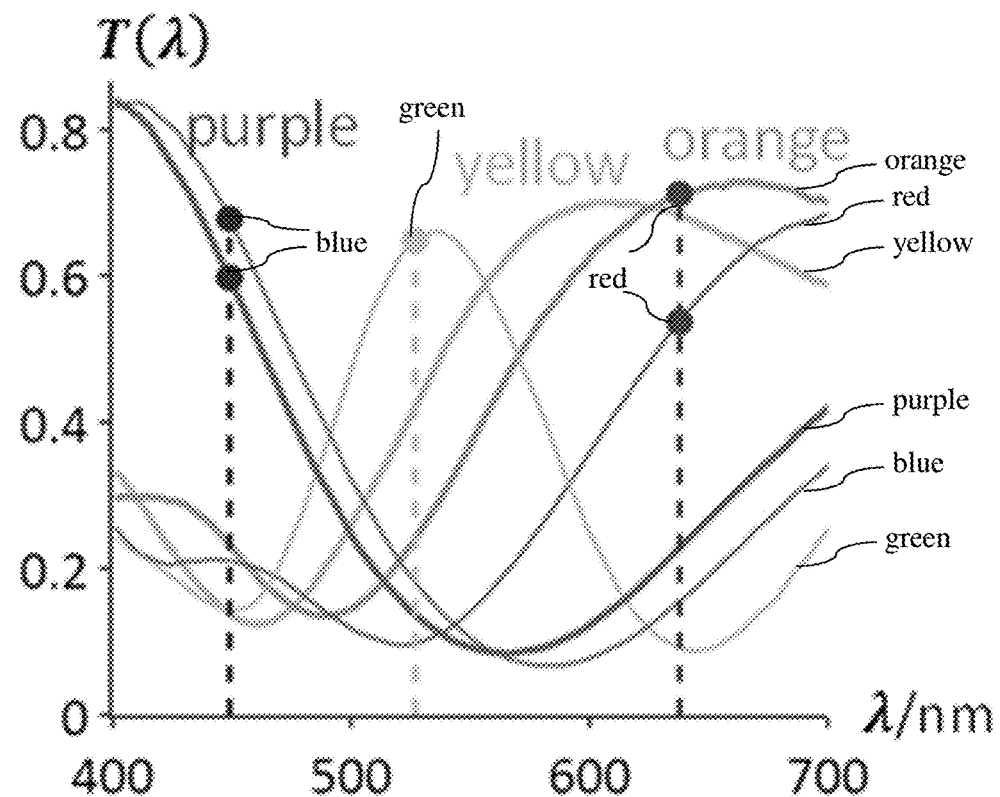
Figure 7D:
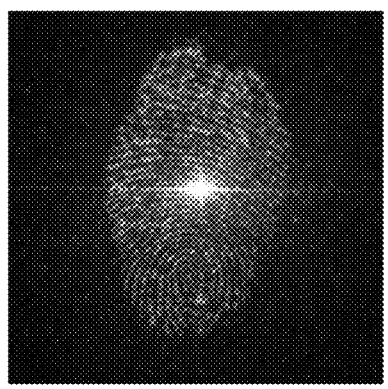
Figure 7E:
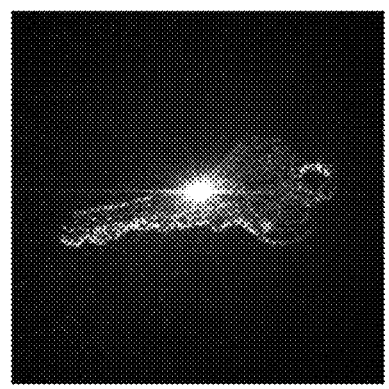
Figure 7F:

FIGS. 7A to 7F relate to an exemplary six-colour holographic colour print 700 providing enhanced optical security. FIG. 7A depicts a transmission optical micrograph of the colour print 700, a 480×480 pixel (e.g., 1.44 mm²) reproduction of Luigi Russolo's painting "Perfume" under which three holograms have been multiplexed. The ability to include colours that are less suitable for multiplexing the holograms (spectral freedom) allowed the ability to expand the usable colour palette to a total of six colours. FIG. 7B depicts optical micrographs of pillar arrays that produce the colours used in the print 700, namely, added colours orange, yellow, purple (micrographs marked with a dashed box) and original colours red, green, and blue. Overlaid percentages on the micrographs of each pillar array denote the proportion of pixels in the print with that colour. Coloured boxes (as labelled) around the pillar micrographs indicate that they are used in the hologram channel of that colour. FIG. 7C denotes transmission spectra of pillar array colour filters used in the print 700, namely, original colours in thin lines; and added colours in thick lines. FIGS. 7D to 7F depicts holographic projections of the print in transmission, photographed on a white wall in a darkened room, being a red thumbprint (FIG. 7D), a green key (FIG. 7E), and blue lettering that reads "SECURITY" (FIG. 7E). Illumination sources were 638 nm red, 527 nm green, and 449 nm blue lasers, respectively. The projection size scales with the projection distance, reaching an average size of approximately 10 cm at a distance of 1 m. Original source images and simulation results of the colour image and holograms can be found in FIG. 23, which will be described later below.

Accordingly, the additional colours were assigned to their closest match within RGB, more specifically, orange colour filters were placed over phase plates belonging to the red hologram and purple colour filters over phase plates of the blue hologram (see FIG. 7B). As the yellow colour filters had poor selectivity between transmitting red light and green light (FIG. 7C), various example embodiments opted not to store any hologram information in the phase plates under yellow filters as their high transmission at both wavelengths would cause the red projection to appear on the green channel as crosstalk and vice versa. However, if no information was stored in the yellow pixels, various example embodiments found that their constant phase would contribute to the transmitted zero-order (undiffracted) beam. To address this, various example embodiments instead applied a random phase to diffuse the contribution from the yellow pixels into a uniform background.

In the final six-colour print, the high fidelity of holographic projections and remarkable lack of discernible crosstalk between them (see FIGS. 7D to 7F) demonstrates that it is possible to pattern complex and colourful images without sacrificing the quality of the multiplexed holograms in the same print. Various example embodiments note that the nature of the Perfume print 700 allowed for the use of error diffusion dithering in recolouring the image to obtain an optimal random pixel arrangement for high quality holograms (e.g., see Section "Pixel Arrangements for Spatial Multiplexing of Holograms", which will be described below). However, dithering could not be applied to the QR code print in FIG. 6A as it locally scrambles the colours and positions of the pixels across the entire image, which would render the QR code impossible to scan. In order to accurately reproduce the QR code, various example embodiments opted to retain its original (suboptimal) blocky pixel arrangement at the cost of slightly blurring the projections. The effects of different pixel arrangements on multiplexed holograms are compared in FIG. 22, which will be described later below.

Accordingly, a useful feature of the holographic colour prints according to various example embodiments is that it is easy to view both the colour image and the holographic projections without specialised equipment (e.g., see Section on "Practical Applicability of Holographic Colour Prints", which will be described later below). The colour image can be captured by a handheld phone camera with a macro lens under narrow-beam white light illumination (e.g., see FIG. 14, which will be described later below) such as that from a collimated flashlight. Because the holographic projections appear on-axis, they are perfectly overlapped under collinear illumination and may potentially be used for full-colour projection (e.g., see FIG. 18, which will be described later below). The projections can be seen over an approximately 30° range of illumination angles (e.g., see FIG. 15, which will be described later below), which is convenient for handheld viewing with a laser pointer. Due to the relatively high efficiency of the holograms (e.g., see Table 2100 in FIG. 21, which will be described later below), the projections from even a low power laser pointer are visible under normal room lighting (e.g., see FIG. 17, which will be described later below). The overall experimental efficiency of the all-dielectric prints according to various example embodiments is as high as 10% to 20% for holographic laser projection and 30% for colour image transmission (e.g., see Section on "Efficiency Measurements", which will be described later below).

Accordingly, various example embodiments developed a monolithically integrated pixel that layers a structural colour filter over a phase plate to provide combined phase and amplitude control. The design method or algorithm according to various example embodiments enable prints including large arrays of these pixels to be formed or created to simultaneously fulfil the objectives of hologram multiplexing and colour image formation. In various example embodiments, holographic colour prints are fabricated as passive standalone devices capable of showing a colour image and multiple holographic projections under different illumination conditions. Because their phase and amplitude control is purely structural and the structures are made of a single material, the prints according to various example embodiments can be completely described by a height map, in other words, information may be stored only in their surface topography. In this regard, various example embodiments may replicate the surface relief profile of their structures by nanoimprint lithography to manufacture the prints. Various example embodiments further provides pixel-level control of various properties of light for enabling the development of further practical optical security devices.

An exemplary method 800 for designing or configuring an example holographic colour print will now be described with reference to FIG. 8 according various example embodiments of the present invention.

Figure 8:
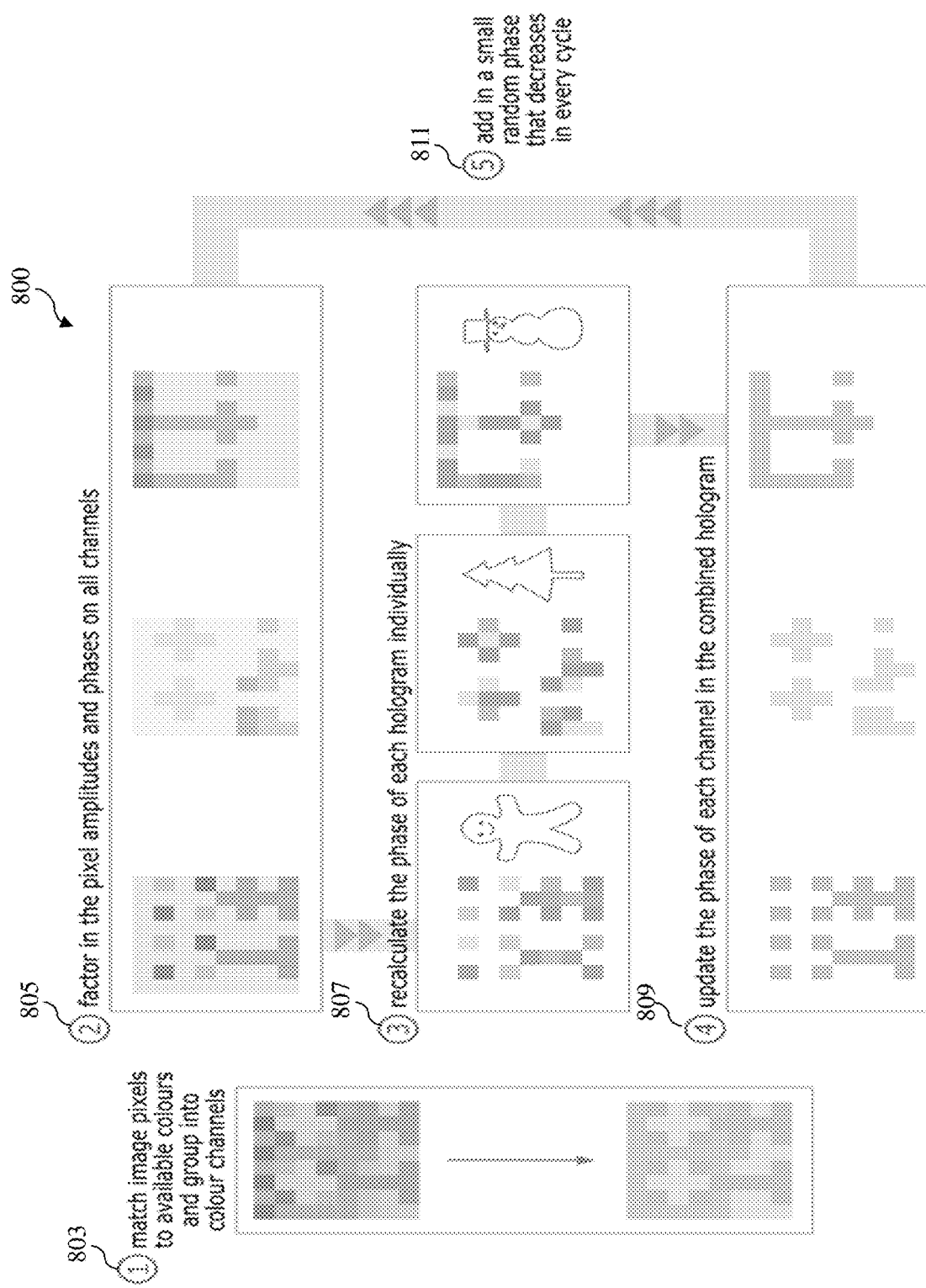
FIG. 8 depicts an exemplary method for designing or configuring an example holographic colour print, according to various example embodiments of the present invention.

FIG. 8 depicts a flowchart of a design (or configuration) method (or algorithm) 800 for combining colour image formation and spatial multiplexing of holograms. An initial stage 802 of the method (e.g., a first step or Step 1) recolours the input colour image using a limited colour palette and then divides the colour pixels into several groups (channels) based on their suitability for filtering each hologram. After the assignment in Step 1, the main body or stages of the method (e.g., second to fifth steps or Steps 2 to 5) may apply a modified Gerchberg-Saxton algorithm that takes into account the arrangement of pixels as well as their amplitudes (spectral profiles) and phases in order to iteratively re-optimise the phase of the holograms on each channel. Despite the imperfect selectivity of the pixel amplitudes (e.g., there is non-zero passage of light at unwanted wavelengths, which results in crosstalk between channels), a satisfactory balance between the quality of the colour image and holographic projections can be achieved by using a sufficiently large number of pixels, which allows for both spatial (e.g., as exemplified by FIGS. 6A to 6H) and spectral (e.g., as exemplified by FIGS. 7A to 7F) degrees of freedom to be exploited.

In various example embodiments, a computer executable program, such as an iterative multi-objective MATLAB code, may be written to perform the colour image matching and phase calculation for each hologram channel (i.e., the method 800) as shown in FIG. 8. Accordingly, there may be provided a computer program product, embodied in one or more non-transitory computer-readable storage mediums, including instructions executable by at least one processor to perform the method 800. The method 800 includes obtaining (at 803, e.g., a first step or Step 1) as input data a set of microscope images and spectral profiles collected from different colour filters (e.g., a large number of different colour filters) including pillar arrays with varying dimensions (the spectra used were averaged from colour filters on blocks of several thicknesses, as described hereinbefore with reference to FIGS. 5A to 5E). For example, this data provides the colour as well as transmittance/reflectance (amplitude) of the pillar arrays at specific desired wavelengths. At 803, each pixel of the colour image to be patterned may be colour-matched to the closest available colour in the dataset while balancing two considerations: the majority of the pixels in the image have colours that are suitable for filtering RGB wavelengths, and the number of unique colours minimised to keep patterning time short. Once the colour filters are selected, the colour image is recoloured accordingly and the corresponding spectral profiles are used to generate a map of amplitudes (transmittance/reflectance of each pixel at red, green, and blue wavelengths). This information may then be fed to a modified Gerchberg-Saxton algorithm (e.g., at 805, 807, 809, 811, e.g., second to fifth steps or Steps 2 to 5) to iteratively optimise the phase of each element so as to best achieve three separate red, green, and blue grayscale holographic projections. In various example embodiments, a size of 480×480 pixels may be used for the holographic colour prints, which was found to be computed in less than one minute by running the iterative multi-objective MATLAB code on a modern laptop (e.g., see "Hologram Computation", which will be described later below).

An exemplary method 900 for fabricating an exemplary holographic colour pixel 901 will now be described with reference to FIGS. 9A and 9B according various example embodiments of the present invention.

Figures 9A, 9B:
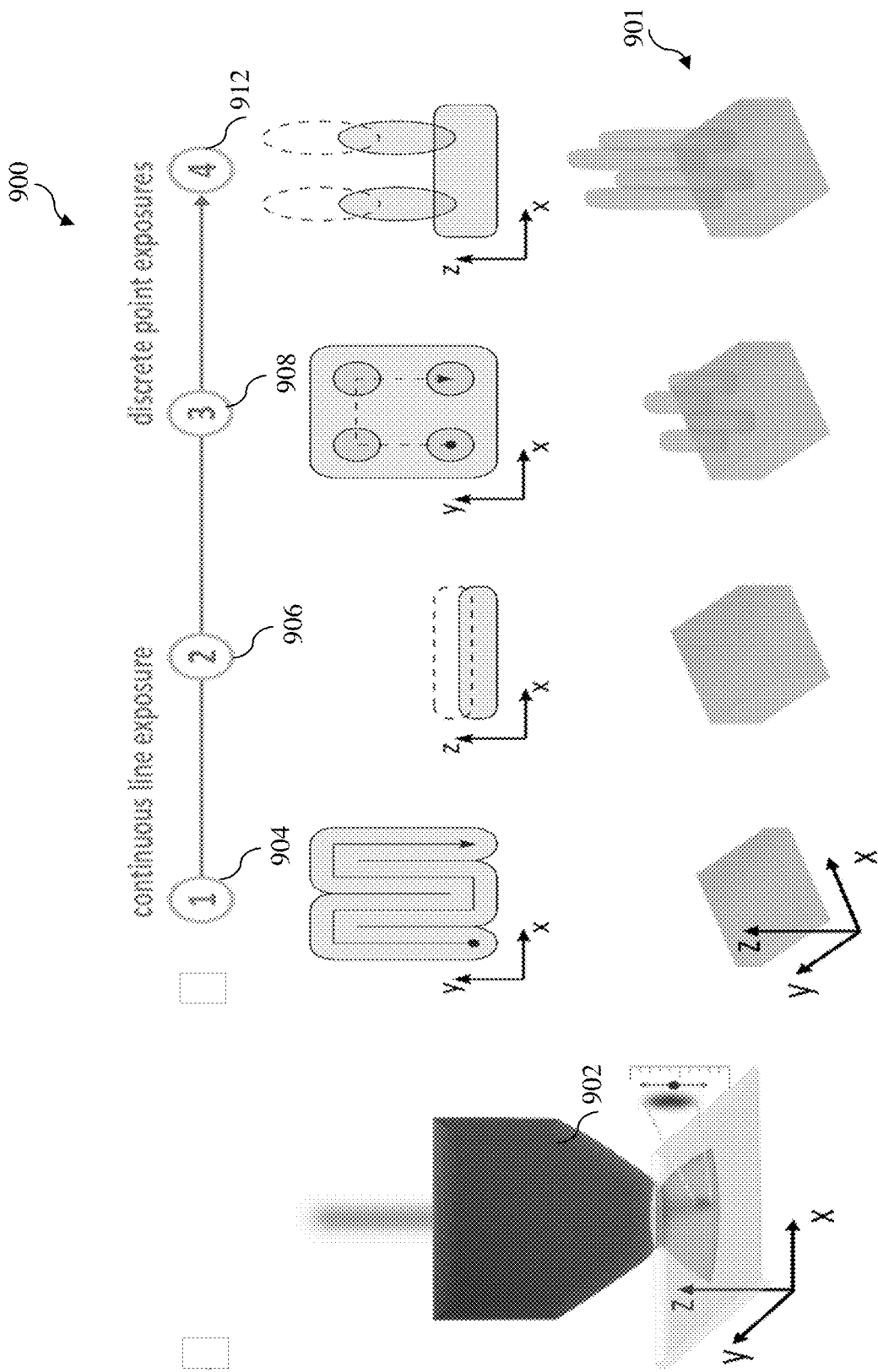
FIGS. 9A and 9B depict an exemplary method or process for fabricating an exemplary holographic colour pixel, according various example embodiments of the present invention.

In the direct laser writing exposure process, as shown in FIG. 9A, a 780 nm femtosecond pulsed IR laser beam may be focused into a liquid puddle of negative-tone photoresist 902. At the focal point of the laser spot, the UV-sensitive photoresist may be cross-linked by two-photon polymerisation and becomes solid. Unexposed photoresist remains as a liquid and may be later washed away during development. The laser spot may be translated in three dimensions (x, y, and z) according to the sequence as shown in FIG. 9B to create complex structures. Resolution in the z-direction is not limited by the axially elongated shape of the point spread function as it is determined by the positioning accuracy of the laser spot.

FIG. 9B depicts a method (process flow) 900 for fabricating a holographic colour pixel 901 based on direct laser writing. The method 900 includes creating (at 904, e.g., first step or Step 1) blocks by rastering the laser spot to fill a square in the xy-plane with a continuous line exposure (hatching); optionally repeating (at 906, e.g., second step or Step 2) Step 1 at higher z-positions (slicing); creating (at 908, e.g., third step or Step 3) pillar arrays by point exposures, where the diameter may be controlled by the exposure dose; and optionally repeating (at 910, e.g., fourth step or Step 4) Step 3 at higher z-positions. Block thickness and pillar height may be controlled in Steps 2 and 4 by overlapping multiple layers of exposures along the z-direction. Accordingly, a full holographic colour print may be made by patterning an array of pixels with various block and pillar dimensions, for example, based on a phase and amplitude map.

In various example embodiments, from the phase and amplitude maps created by the design method 800 in FIG. 8, a separate MATLAB code generates a blueprint of structures (phase plates and pillar array colour filters) with appropriate dimensions to achieve the desired phase and amplitude. This structural blueprint may be converted into a set of instructions for controlling the laser writing sequence used in the fabrication method 900.

Therefore, a holographic colour print including phase plates and colour filters may be fabricated in a single lithographic process by 3D direct laser writing on glass substrates according to various example embodiments. A femtosecond pulsed IR laser may be focused by a high numerical aperture immersion microscope objective into the photoresist as a tight spot of submicron size. Two-photon absorption and polymerisation occur in the UV-sensitive photoresist at the focal point of the laser spot, which can be scanned laterally and shifted axially (refocused) relative to the photoresist/glass interface according to a predefined writing sequence to write a desired pattern including points and lines, as illustrated in FIG. 9B. Cross-linking of the negative-tone photoresist along the laser exposure path creates the phase plates and colour filters as solid polymer structures on the glass.

In various example embodiments, the area to be patterned was split into a square grid of 120×120 $\mu m^2$ write-fields based on the maximum undistorted field of view of the microscope objective. The write-fields were written sequentially and stitched together by successive translations of the stage on which the substrate was mounted. In each write-field, blocks of the same thickness were grouped and the writing sequence in FIG. 9B was performed for each group in ascending order of thickness. Within each group of blocks, all blocks were patterned before their pillars were patterned. In this regard, grouping the blocks by thickness instead of spatial coordinate has advantageously been found to minimise patterning time, as refocusing in the z-direction was found to be much slower than lateral scanning in the xy-plane. In various example embodiments, the total writing time for a 1.44 mm square print (480×480 array of 3 $\mu m$ pixels) was 6 to 8 hours.

For better understanding of the present invention, according to various example embodiments, further details of the holographic colour print and the method of forming the holographic colour print as described hereinbefore according to various example embodiments will now be described below, along with various discussions or observations where appropriate.

Materials

In various example embodiments, in the method of forming the holographic colour print, such as described hereinbefore with reference to FIGS. 9A and 9B, solvents were purchased from Sigma-Aldrich and used as-is. Photoresist (IP-dip, Nanoscribe GmbH) and glass substrates (fused silica, 25 mm squares with a thickness of 0.7 mm) were purchased from Nanoscribe GmbH.

Sample Fabrication

In various example embodiments, in the method of forming the holographic colour print, such as described hereinbefore with reference to FIG. 9B, direct laser writing was performed in a Photonic Professional GT system (Nanoscribe GmbH). A 780 nm femtosecond pulsed IR laser with a 90 fs pulse duration and 80 MHz repetition rate (Toptica FemtoFiber Pro) was focused into a puddle of liquid IP-dip photoresist by an immersion objective (Zeiss Plan Apo 63×, NA 1.4) to induce two-photon absorption and polymerisation. The lateral position of the laser spot was controlled by using galvanometric mirrors to deflect the beam within the field of view of the objective lens, whereas the axial position of the spot was controlled by using a piezoelectric and mechanical translation stage to shift the photoresist/substrate interface relative to the focal plane of the objective lens. This rastering of the laser spot created pixels and prints as cross-linked polymer structures on a glass substrate.

The laser power incident on the entrance aperture of the objective lens was controlled by an acousto-optic modulator (AA Opto-Electronic). For line exposures (blocks), the scan speed was 8000 $\mu m\ s^{-1}$ and the laser power 21.0 mW for the first raster scan and 16.8 mW for the second raster scan. The hatching pitch was 250 nm and slice thickness 0.70 $\mu m$. For point exposures (pillars), the exposure time was varied between 0.02 ms and 0.04 ms and the laser power between 33.3 mW and 46.4 mW, and the slice thickness ranged from 0.69 $\mu m$ to 1.01 $\mu m$. The slice thickness was adjusted to match the (dose-dependent) axial elongation of the point spread function of the laser spot while maintaining a vertical overlap of approximately 30% (300 nm to 430 nm depending on the size of the laser spot in the vertical direction).

To wash away the excess unexposed liquid photoresist, development was carried out by immersion of the sample in polyethylene glycol methyl ether acetate (PGMEA) for 5 minutes and then isopropyl alcohol (IPA) for 3 minutes, followed by transfer into nonafluorobutyl methyl ether (NFBME) as a low surface tension solvent for the final drying step. Due to the large difference in density between the two solvents, residual IPA carried over from the previous step would float on the surface of NFBME and was siphoned off before removing the sample. This step minimises recontamination of the sample with IPA when it was withdrawn through the surface, as the IPA would otherwise dry on the sample and cause the pillars to collapse due to its relatively high surface tension.

Phase Plate Thickness Calibration

In various example embodiments, in the method of configuring or calibrating phase plate thickness, such as described hereinbefore with reference to FIG. 5A, polymerised IP-dip photoresist with a refractive index of 1.54 to 1.58 across the visible spectrum was used, and the block thickness determined for $2\pi$ phase modulation was 0.79 μm, 0.95 μm, and 1.17 μm at the design wavelengths of 449, 527, and 638 nm. To span the required or desired range of thicknesses and avoid unwanted shifts in filter colour at thicknesses below 0.6 μm, a thickness range of 0.6 μm to 1.8 μm was used. A series of blocks fabricated with different thicknesses in this range was scanned with a stylus profilometer (KLA Tencor) at a lateral speed of 10 μm s$^{-1}$ and a force of 0.10 mg for thickness calibration. Based on the thickness errors found, the limit of placement accuracy of the laser spot was estimated to be 100 nm in the axial direction. As such, the thickness in steps of no smaller than 100 nm was discretised, corresponding to quantised phase levels of $0.25\pi$, $0.21\pi$, and $0.17\pi$ for blue, green and red light, respectively. With a strict lower limit of 100 nm on the thickness step size, the number of phase levels used in the final prints was rounded down to 7, 9, and 11, respectively. Various example embodiments found that patterning too many phase levels is time-consuming and can be counterproductive as an unfavourable sequence of axial positioning errors from the piezoelectric stage may then cause undesirable reversals in the phase profile.

Scanning Electron Microscopy

In various example embodiments, scanning electron micrographs were acquired in a field emission scanning electron microscope (JEOL JSM-7600F) at an accelerating voltage of 5.0 kV and a working distance of 6.7 mm.

Hologram Computation

In various example embodiments, the iterative multi-objective code described hereinbefore (MATLAB R2017b) was executed on a Microsoft Surface Pro with an Intel i5-7300 2.60 GHz processor and 8 GB of RAM. In this regard, it was found that the design algorithm described hereinbefore according to various example embodiments generated a 480×480 pixel three-colour multiplexed hologram in less than one minute.

Simulations

In various example embodiments, the holographic projections shown in FIGS. 22A to 22C and 23 (which will be described later below) were simulated based on the output of the design algorithm (a phase map and an amplitude map) using the same source images as in FIG. 4, FIGS. 6C to 6E, and FIGS. 7A and 7D to 7F described hereinbefore. In various example embodiments, the simulated projections were calculated from the phase and amplitude maps in MATLAB as follows. First, the element-wise product of the phase map (in phasor form) and the amplitude map is computed, approximating the initial electric field distribution of light immediately after being transmitted through the print. Then a Fourier transform is taken, approximating the propagation of light into the far field (in the Fraunhofer limit). Lastly, the square modulus is taken to convert the electric field strength into an intensity image, shown in logarithmic scale to approximate the human visual response.

Photography of Holographic Projections

In various example embodiments, holograms were projected in transmission onto a white wall and photographed using a DSLR camera in a darkened room. Coherent illumination was provided by 638 nm red, 527 nm green, and 449 nm blue laser diode modules with a maximum power of 4.5 mW (ThorLabs). Within the setup, the actual power at the sample was measured to be approximately 2 mW on average. The distance of the holographic colour prints from the wall (projection distance) was 135 cm, at which the holographic projections measured between 10 and 15 cm across. Photographs of the holographic projections in FIGS. 6D and 6E and FIGS. 7D to 7F described hereinbefore show an approximately 20 cm$^2$ region centered on the projection.

Optical Characterization

In various example embodiments, optical micrographs and spectra were acquired in a Nikon Eclipse LV100ND optical microscope equipped with a CRAIC 508 PV microspectrophotometer and a Nikon DS-Ri2 camera. Samples were backlit by halogen lamp illumination and measured in transmission through a 5×/0.15 NA objective lens. As the colour filters are diffractive in nature, wavelengths that pass are transmitted on-axis while rejected wavelengths are diverted off-axis. Thus, the transmittance spectra were measured in a narrow cone of acceptance angles using an objective with a numerical aperture of 0.15 (a half-angle of 8.6°).

Colour Filter Selection

In various example embodiments, spectra were analysed by comparing their average transmittance within three narrow wavelength bands centered at the red, green, and blue laser wavelengths, $T_R$, $T_G$, and $T_B$. For each spectrum, these values were used to calculate figures of merit $\chi_R$, $\chi_G$, and $\chi_B$ that determine the suitability of the corresponding pillar array for use as a red, green, or blue colour filter. In various example embodiments, the figure of merit for a red colour filter $\chi_R$ may be the sum of the difference between red and green transmittances and the difference between red and blue transmittances, i.e., $\chi_R = (T_R - T_G) + (T_R - T_B) = 2T_R - T_G - T_B$.

A matrix representation was used in the code to enable vectorisation of the actual calculations.

Although a more accurate figure of merit may take into account the wavelength selectivity for each possible set of filters as a group (as will be further described later) rather than for individual filters, various example embodiments did not adopt this in the design algorithm as it would greatly increase the number of computations.

Colour Palette and Wavelength Selectivity

Figures 10A, 10B, 10C:
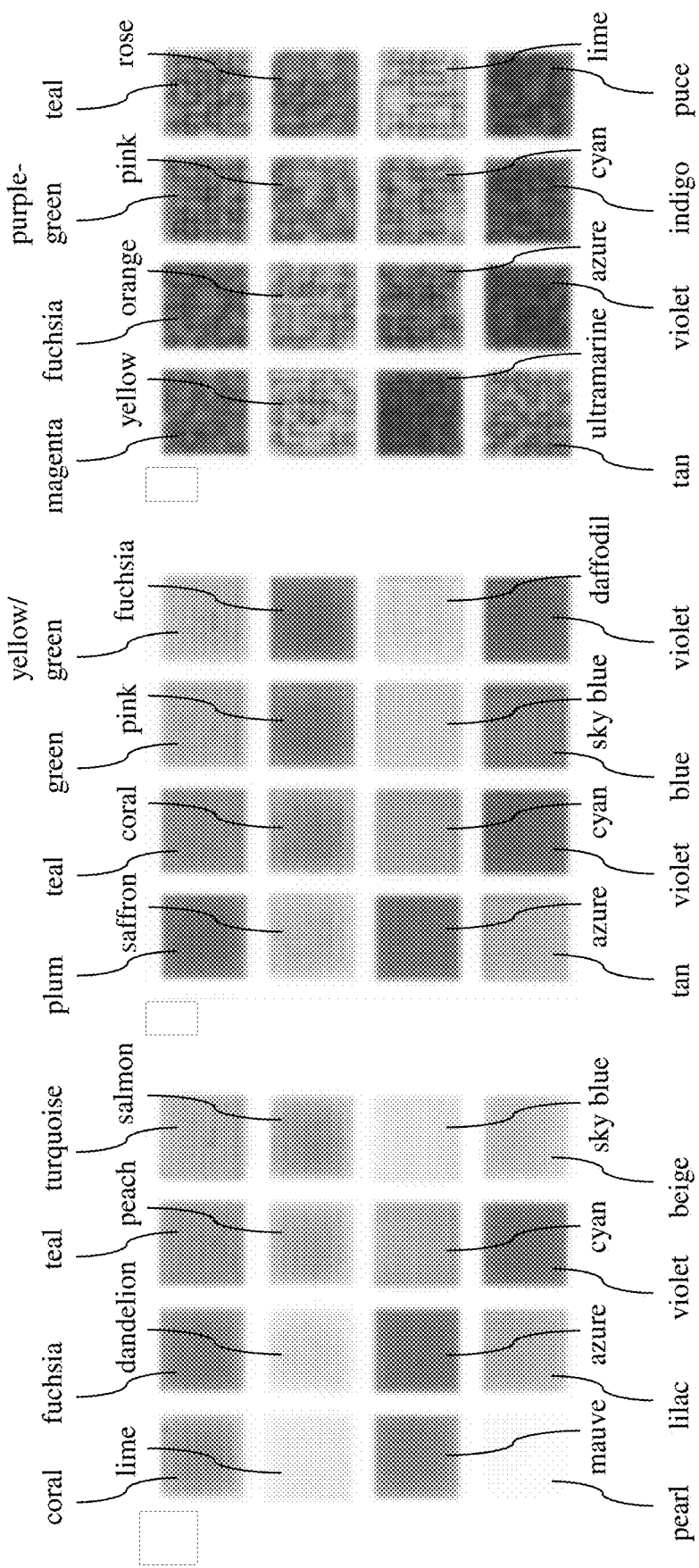
FIGS. 10A to 10C depict exemplary ranges of colours attainable by varying the pillar dimensions of the colour filters, according to various example embodiments of the present invention.

According to various example embodiments, ranges of colours attainable by varying the pillar dimensions (e.g., height and diameter) of the pillar array colour filters are shown in FIGS. 10A to 10C. In particular, colour palettes derived from pillar array colour filters by varying the pillar dimensions of height and diameter are shown, for without blocks underneath (i.e. with a block thickness of 0 μm) (FIG. 10A), with blocks of thickness 1.0 μm under the pillars (FIG. 10B), and with blocks of random thicknesses in the range 0.6 μm to 1.8 μm under the pillars (FIG. 10C). The pitch of the pillar arrays is 1.0 μm in all cases.

It was found that pillars on blocks (FIGS. 10B and 10C) give darker colours that are spectrally shifted from the colours of pillars patterned directly on the glass substrate (FIG. 10A). Accordingly, in various example embodiments, the block thicknesses for the prints were configured or selected to lie in a range (0.6 μm to 1.8 μm) over which the pillars showed little to no colour change with block thickness (e.g., see FIG. 10C), so as to afford relatively thickness-independent colour filters. The spectra measured for colour filters with blocks of thickness in this range were then averaged to minimise the effects of any remaining thickness dependence on designing prints.

Figure 11A:
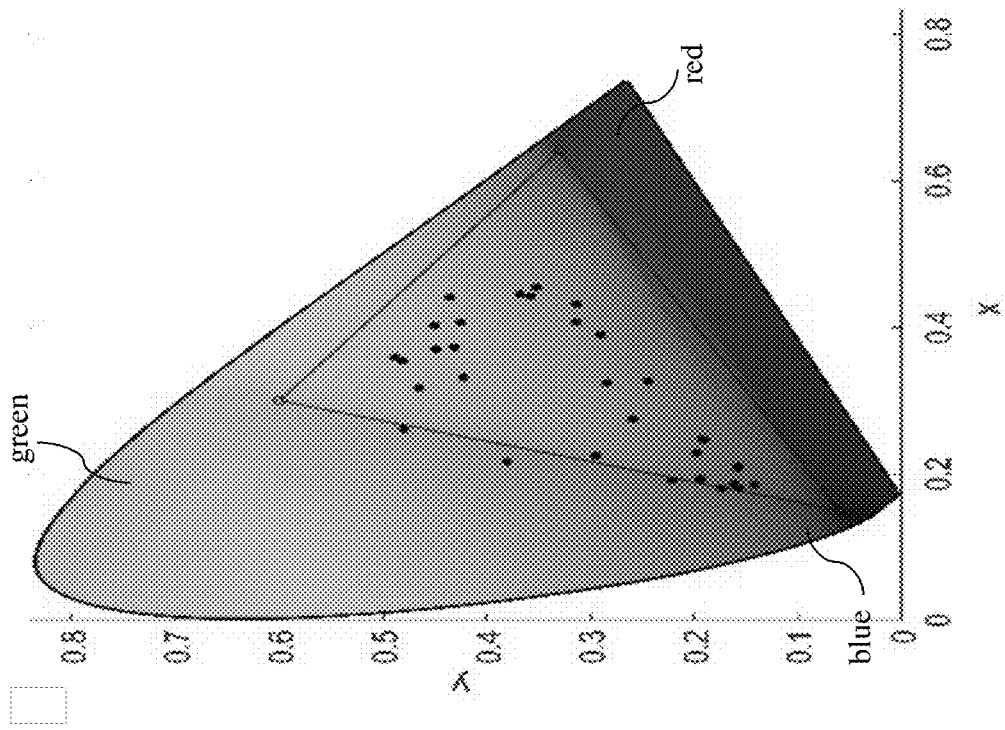
FIGS. 11A and 11B show comparisons of filter colours under different conditions of block thickness, according to various example embodiments of the present invention.
Figure 11B:
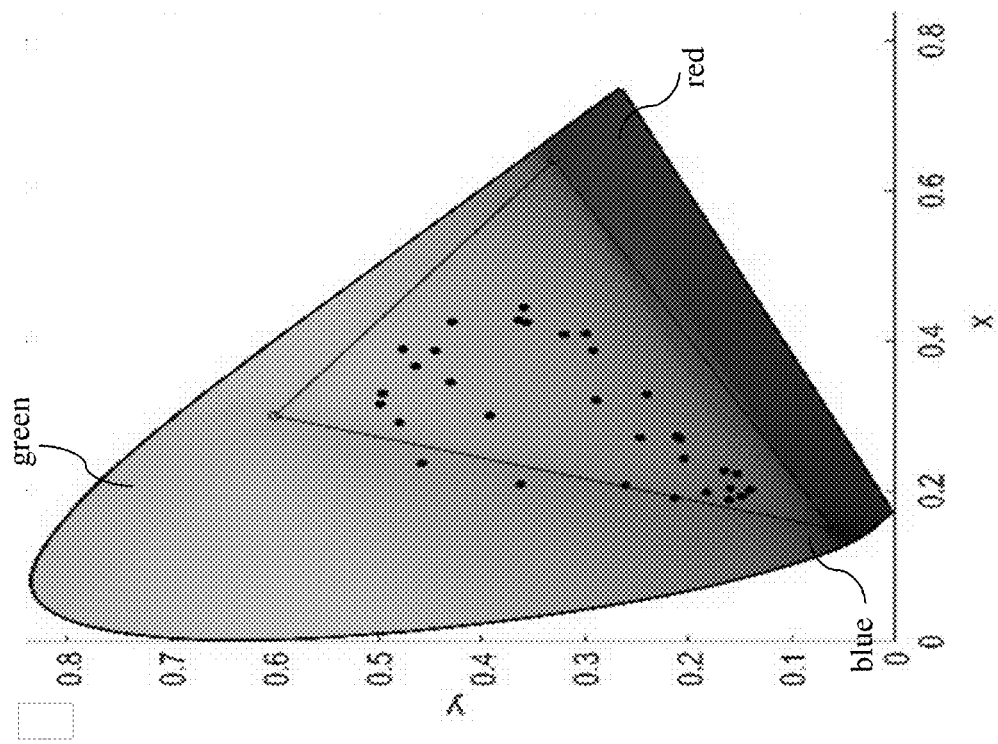

FIGS. 11A and 11B show comparisons of filter colours under different conditions of block thickness. In particular, FIG. 11A illustrates a colour space plot for colour filters on blocks of thicknesses 0.6, 1.0, 1.4 and 1.8 μm, with colours converted from thickness-averaged spectra for a 1931 CIE 2° standard observer viewing under illuminant D65 (white light with a colour temperature of 6500 K). For these colour filters, the pillar height and diameter were varied in the ranges 0.5 μm to 2.7 μm and 310 nm to 390 nm, respectively, achieving a 53% coverage of the sRGB colour gamut. FIG. 11B illustrates a colour space plot for colour filters on blocks of thickness 1.0 μm with no averaging performed. There are no major differences between the colour space plots in FIGS. 11A and 11B as the colour is almost independent of block thickness in this thickness range (0.6 μm to 1.8 μm).

Accordingly, the similarity between the colour space plots in FIG. 11A (averaged) and FIG. 11B (1.0 μm thick) show that there was in fact almost no thickness dependence remaining even before averaging. The coverage relative to sRGB of the averaged spectra was 53%, wide enough for us to pick out suitable filters for colour prints. Table 1200 in FIG. 12 lists the dimensions of pillars and the thickness-averaged RGB transmittances of the colour filters in the Perfume print 700. In particular, Table 1200 shows the dimensions of pillars and RGB transmittance values for the colour filters in the Perfume print 700. The transmittance spectra were averaged over blocks of thicknesses 0.6, 1.0, 1.4 and 1.8 μm, and the transmittance values further averaged over a narrow bandwidth of 4 nm centred at the wavelengths 449 nm (blue), 527 nm (green), and 638 nm (red), as well as a broadband spectral range of 450-650 nm (white).

By performing experiments to explore the parameter space of pillar dimensions, various example embodiments were able to identify a set of three colour filters with adequate wavelength selectivity for multiplexing RGB holograms. In various example embodiments, the wavelength selectivity of transmission may be defined as the ratio of transmittances at the design wavelength for a colour filter designed to pass it and a colour filter designed to reject it. The RGB wavelength selectivity for the chosen or selected set of colour filters was calculated and shown in Table 1300 in FIG. 13, and ranges from 3.2 to 6.6 among the red, green and blue colour filters, for an average selectivity of 4.6. In particular, Table 1300 shows the RGB wavelength selectivity of the colour filters in the Perfume print 700. The selectivity values were calculated from the transmittance values and shown in Table 1200. Mutual selectivities among the red, green and blue colour filters are highlighted in bold while those involving the yellow filters (not used for multiplexing) are greyed out.

Balancing Wavelength Selectivity in Multiplexed Holograms

According to various example embodiments, in a multiplexed hologram, the overall transmission efficiency for a given channel may be the product of the area fraction occupied by the channel and the weighted average of the transmittance of the colour filters on that channel, with an upper bound of 33% for the case of equal area fractions in an RGB hologram. If unequal area allocation arises from a predominance of one or two colours in the colour image to be printed, this can be compensated by adjusting the colour balance of the image before colour matching. Alternatively, it can also be desirable to deliberately encourage an unequal area allocation when the wavelength selectivity of the filters on one channel is significantly worse than those on others. In this manner, the number of the total hologram pixels allocated to each channel can be adjusted to balance out the transmission characteristics of the filters. For example, if the desired green transmission of the green filters (signal) does not sufficiently exceed the unwanted green transmission of the red and blue filters (noise, which manifests as crosstalk), more green pixels can be allocated to increase the signal-to-noise ratio on the green channel.

According to various example embodiments, a useful metric is the signal strength, which may be defined for each channel as the product of its area fraction and its average transmittance at its design wavelength. Noise strength terms may be defined analogously as the product of the area fraction of a channel and its average transmittance at the design wavelengths of other channels. In this regard, various example embodiments construct a matrix with the signal strengths on the diagonal and the noise strengths as off-diagonal (cross) terms, where the signal-to-noise contrast across all channels is balanced when it most closely approximates a diagonal matrix with a constant baseline shift.

Using this signal-to-noise matrix, it was found that the appearance of crosstalk in the holographic projections was minimised by applying a slight green tint to the colour balance of the source image for the Perfume print 700 in FIG. 7A to give a pixel allocation of 36% in the green channel, 29% in the red channel, 27% in the blue channel, and 8% of yellow pixels not assigned to any channel. This green tint is not obvious in the final printed image, but is only used in the design stage to promote a desired colour matching outcome.

Practical Applicability of Holographic Colour Prints

According to various example embodiments, for practical application of the holographic colour prints as optical security devices, the prints are configured to be usable under non-ideal conditions and without the aid of a specialised viewing setup. Accordingly, in various example embodiments, the colour images are configured so as to not require a microscope to be seen, and the holographic projections are robust to deviations in the illumination angle and easily viewed with a standard laser pointer even in the presence of ambient background light.

Figure 14A:
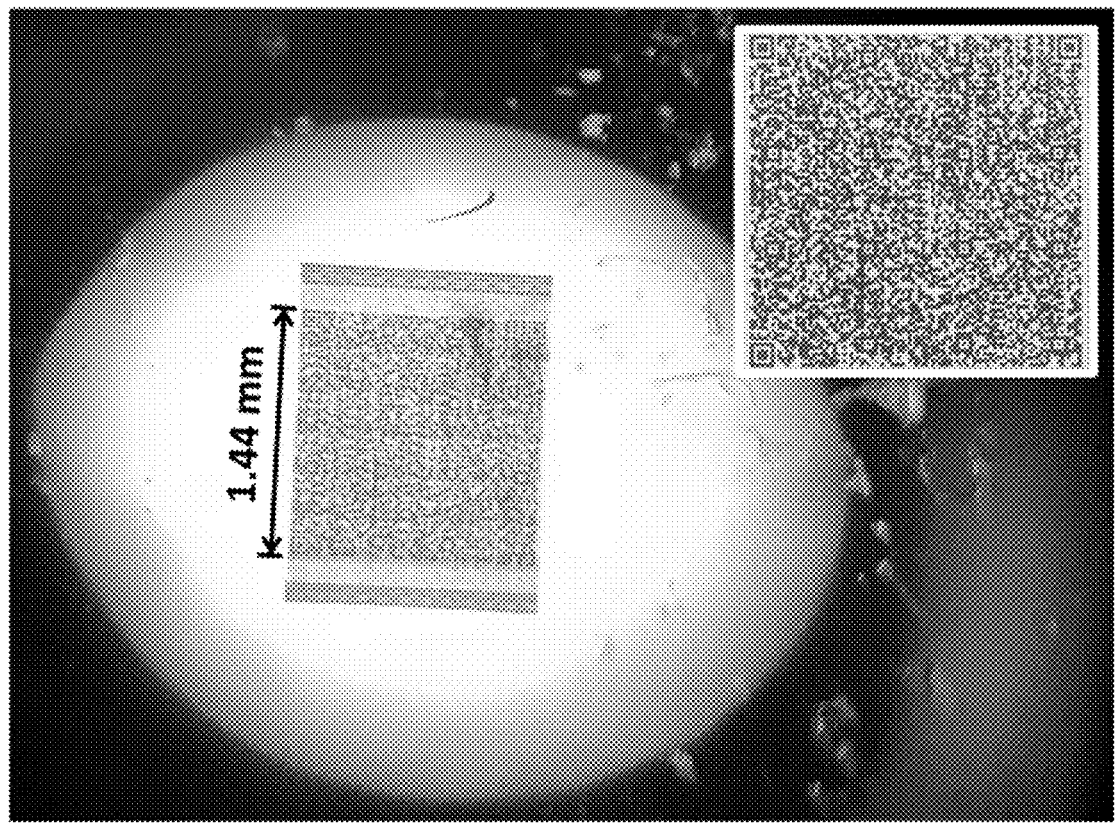
FIGS. 14A and 14B illustrate structural colour images of an exemplary QR code viewed under different numerical aperture conditions, according to various example embodiments of the present invention.
Figure 14B:
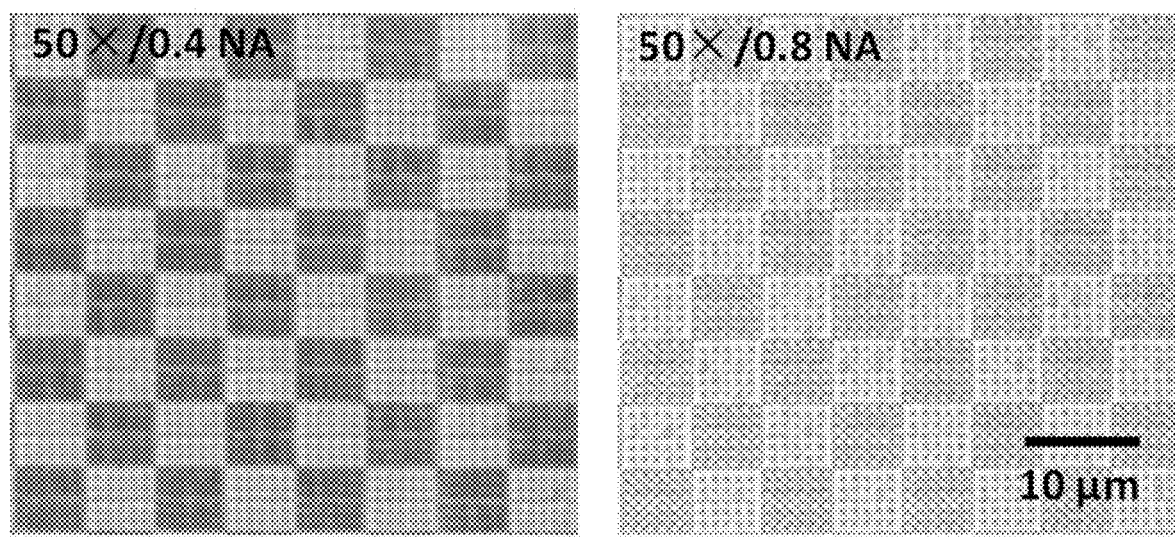

FIGS. 14A and 14B show structural colour images viewed under different numerical aperture conditions. In particular, FIG. 14A depicts a photograph of the QR code print taken using a handheld phone camera (APPLE iPhone 8 Plus) mounted with a low cost 10× macro lens attachment (Shuohu). The sample was backlit with white light transmission illumination from a microscope condenser set to a small numerical aperture of 0.1 for optimal viewing. Any white light source with a narrow beam angle may also be used for illumination. The inset shows the optical micrograph from FIG. 6C for comparison. FIG. 14B shows a comparison of pillar array colour filters imaged with a 50×/0.40 NA microscope objective (left image of FIG. 14B) and a 50×/0.80 NA microscope objective (right image of FIG. 14B) with the condenser set to a matching illumination numerical aperture. In various example embodiments, the illumination numerical aperture may be limited to below 0.4 so that the large collection numerical aperture of a macro lens or high magnification objective does not wash out the diffractive colour.

Accordingly, FIG. 14A demonstrates the possibility of viewing the holographic colour prints according to various example embodiments using a handheld phone camera with a low cost macro lens attachment. The QR code colour image can be clearly seen although fine details cannot be resolved as the macro lens used did not have a high enough magnification. Various example embodiments note that while illumination from a microscope condenser was used for convenience, a focusable or collimated flashlight may also be used to illuminate the colour prints as long as it produces a sufficiently narrow beam. In various example embodiments, a narrow beam may be required or preferred because of the diffractive nature of the colour filters, as explained in the following.

The colour filters may separate incident light into two components: one that is transmitted on-axis (the desired colour) and another that is diffracted away from the optical axis (the complementary colour, which is unwanted). For the intended subtractive colour effect to be produced, only the desired colour is collected according to various example embodiments. If the collection angle of the lens is too large, both components are collected and the colour becomes washed out as they recombine to give the colour of the light source. Alternatively, if illumination is delivered over too wide a range of angles, the angular separation between the two components is lost and again both are collected. Thus the range of illumination and collection angles, i.e., the combined numerical aperture of the imaging system, may be considered according to various example embodiments when attempting to view our colour prints. Since the collection numerical aperture is set by the macro lens, various example embodiments instead control the illumination numerical aperture. Based on the numerical aperture dependence observed in FIG. 14B, the diffractive colour can still be seen up to a numerical aperture of 0.4, or a beam angle of up to ±23°, which is achievable by many common commercially available flashlights.

Figure 15:
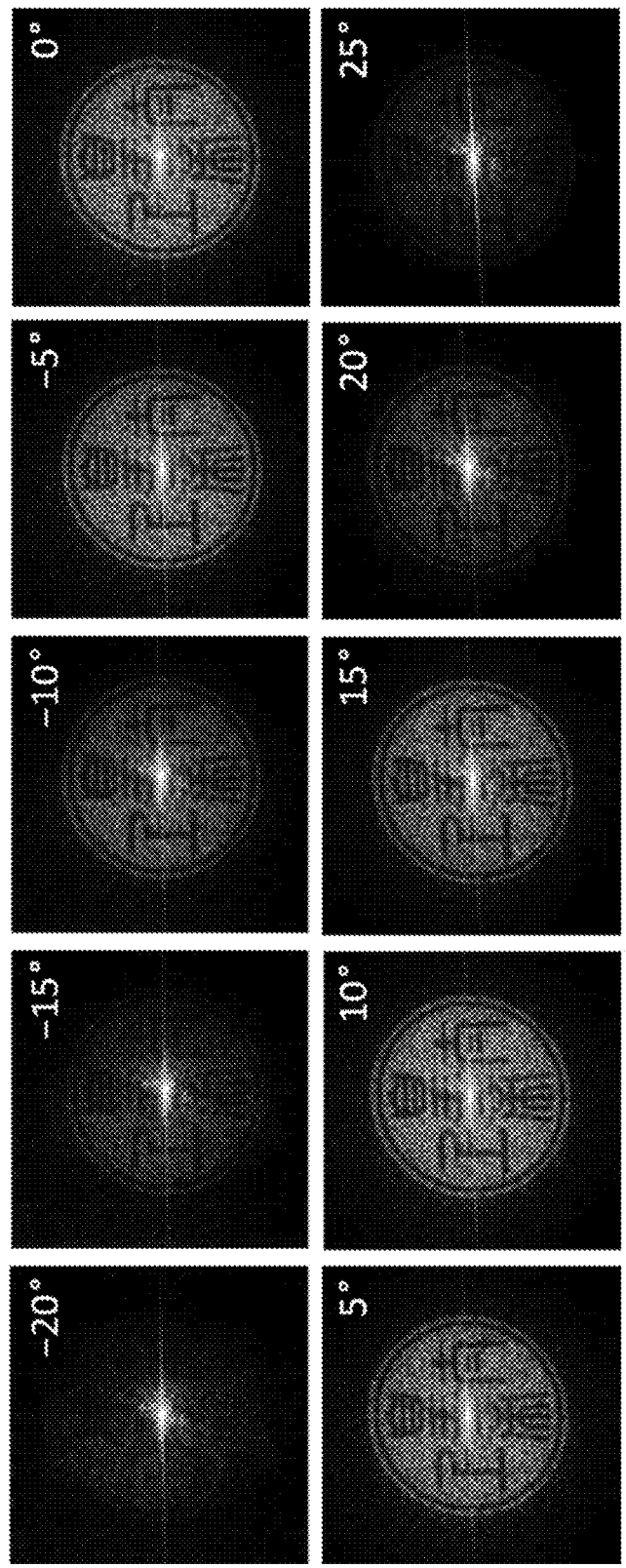
FIG. 15 depicts photographs of exemplary Chinese seal holographic projections captured at various illumination angles, according to various example embodiments of the present invention.

FIG. 15 shows Chinese seal holographic projection viewed at various illumination angles, according to various example embodiments of the present invention. Illumination angles are specified in the top-right corner of each image, with 0° being normal incidence. Positive (negative) angles represent clockwise (anticlockwise) rotations of the print, where the print was rotated to the right (left) while the laser and screen were not adjusted. The projection was maintained over an approximately 30° range of illumination angles, only fading away at −15° to −10° on the left and 15° to 20° on the right.

In particular, to investigate the angle dependence of our prints under laser illumination, the angle at which the beam was incident on a print was varied and the holographic projections were photographed as before. FIG. 15 shows the result of this test on the Chinese seal projection of the QR code print. The projection is essentially angle-insensitive between −5° and 10°, and suffers a slight decrease in brightness at −10° and 15° with little loss in quality. The projection is faintly visible at −15° and 20° and disappears as the angle is increased farther. The slight asymmetry in the usable range of illumination angles might be due to a small average tilt in the pillars of 2° to 3° relative to the normal, possibly introduced during the drying step of the development process. Due to the approximately 30° range of illumination angle tolerance, it is easy to project the holograms by holding the print in one hand and a laser pointer in the other.

Figure 16:
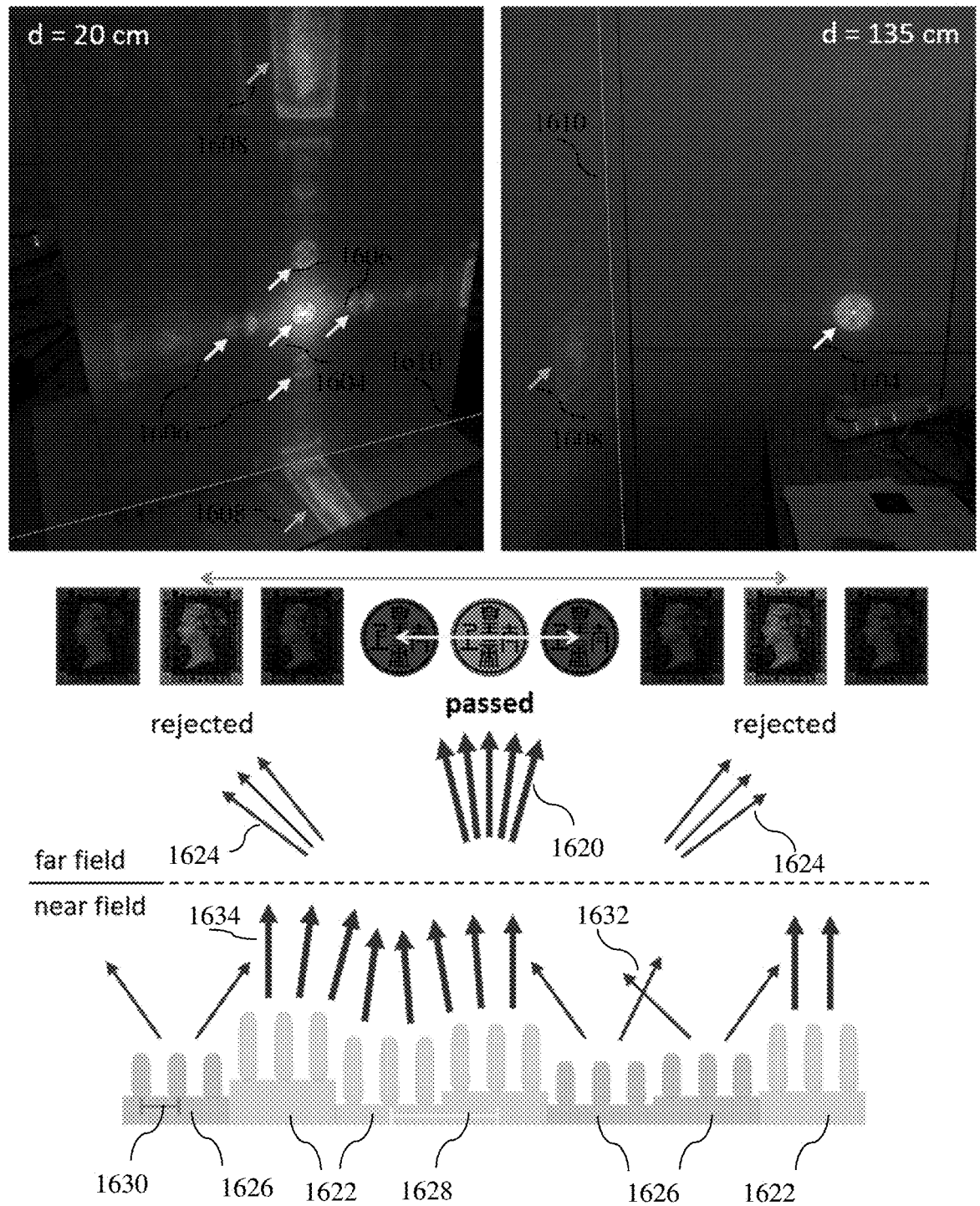
FIG. 16 illustrates the wide-angle characteristics of the exemplary Chinese seal holographic projection, according to various example embodiments of the present invention.

FIG. 16 illustrates the wide-angle characteristics of the Chinese seal holographic projection. Photographs were taken at different projection distances d, with the sample placed: (left image) near a white sheet of paper (d=20 cm) and (right image) far from a white wall (d=135 cm). The central projection (pointed by arrow 1604) is surrounded by higher diffraction orders of the projection (pointed by arrows 1606). At higher angles, the Penny Black stamp holographic projection from the other channel (pointed by arrows 1608) can be seen. The undesirable features that disturb the central projection at d=20 cm are much less apparent at d=135 cm, at which the projection has expanded from 2 cm to 12.5 cm, the higher orders have faded, and the unwanted projection is now over 70 cm away from the main projection. Thin grey lines 1610 mark boundaries where the screen makes a right angle (between two sheets of paper on left, and between two walls on right). The schematic (bottom) illustrates the workings of the colour filters and holograms: red light is passed (indicated by thick arrows 1620) by the yellow colour filters 1622 and rejected (indicated by thin arrows 1624) by the blue colour filters 1626, creating a diffraction pattern in the far field upon which the holographic projections are superimposed. Because the diffraction angle is inversely related to the pitch, the hologram phase plates (pixel pitch 3 μm, scale bar 1628) only weakly modulate the angles of the incident light as compared to the colour filters (pillar pitch 1 μm, scale bar 1630), which divert the light far off-axis when they reject it. As a result, the unwanted projections are well separated from the main projection at 3× the angular separation from the center (indicated by thin arrows 1632) as compared to the first-order peaks (indicated by thick arrow 1634). Note that the projections photographed at d=20 cm and d=135 cm are both well within the far field.

Accordingly, FIG. 16 illustrates the wide-angle characteristics of the print, comparing the appearance of the projection at different distances from the print to the screen. At a distance of 20 cm, the projection size of 2 cm is too small to avoid significant contamination with the central undiffracted zero-order spot. Other undesirable features are also present: the projection is repeated at higher diffraction orders away from the center, and at even higher angles, the projection from the other channel and its higher diffraction orders can be seen. As explained above, because the colour filters work by diffracting unwanted wavelengths off-axis, the unwanted projections still appear, but only at very high angles. Various example embodiments address these problems by using a longer projection distance on the order of 1 m or farther. At a distance of 135 cm, the projection has expanded to a size of 12.5 cm and its features can be more clearly discerned even in the presence of the zero-order spot. The higher diffraction orders (which contain much less power) are weak enough that they can barely be seen, and the unwanted projections from the other channel are far off to the sides, over 70 cm away. Thus, various example embodiments use a projection distance of 135 cm and show photographs of only approximately 20 cm² including the central projection in FIGS. 6D and 7D.

Various example embodiments note that the relative angle independence of the projections and the repeating of the projections at higher orders are both characteristic of holograms in the so-called "thin hologram" regime, which applies to the holograms according to various example embodiments as their thickness of 0.6 μm to 1.8 μm was smaller than their pixel pitch of 3 μm. This is unlike the case of "thick" volume Bragg gratings for which the thickness is much larger than the pitch, which results in sharply angle-dependent projections in only the zero diffraction order.

Figure 17:
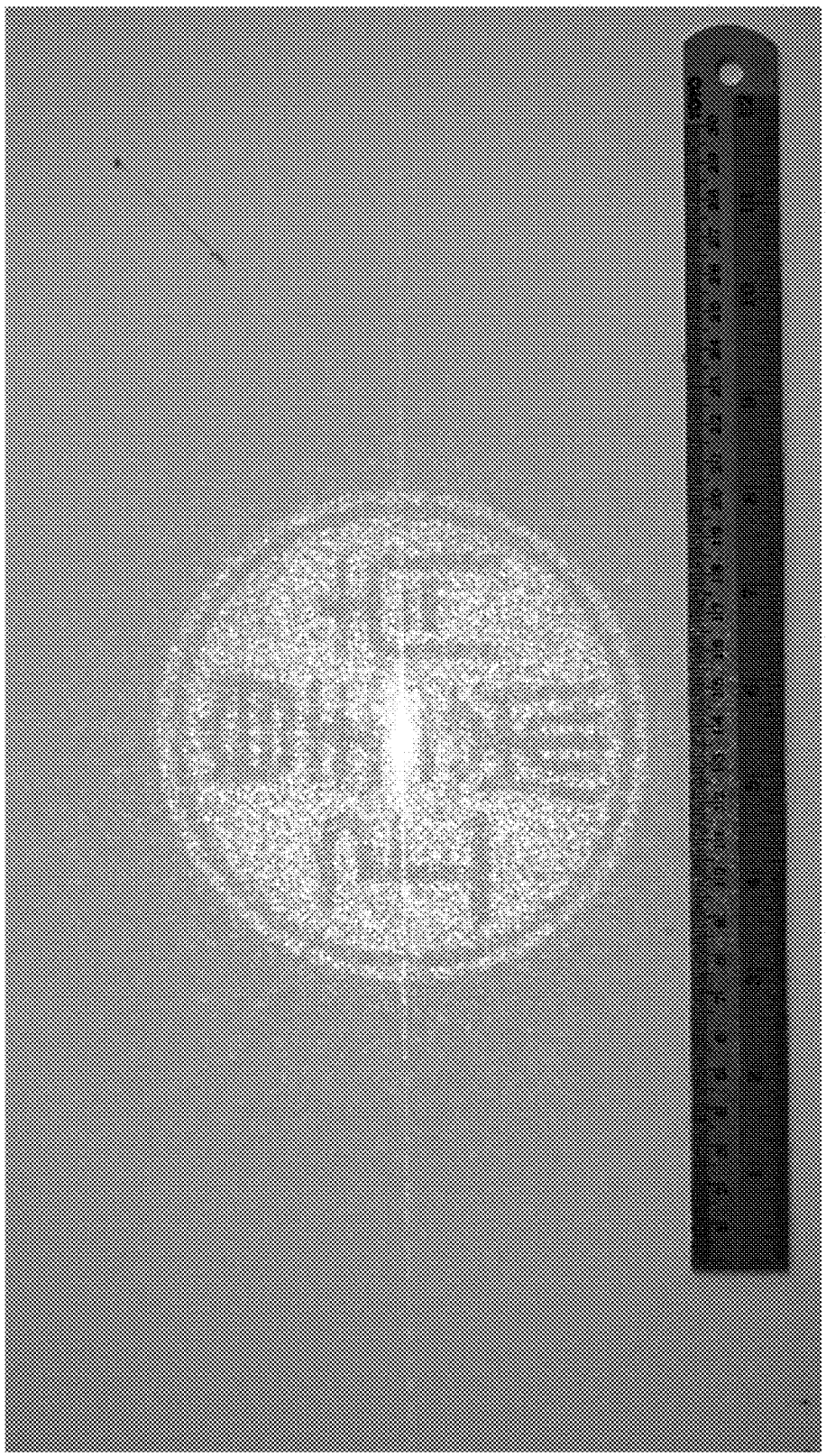
FIG. 17 illustrates the visibility of the Chinese seal holographic projection under ambient lighting, according to various example embodiments of the present invention.

Various example embodiments note that although the projections were photographed in a darkened room for clarity, this is not a requirement for viewing the holograms. The laser power of 2 mW that was used afforded bright projections that could be clearly seen under standard room lighting conditions (e.g., see FIG. 17). In particular, FIG. 17 shows the ease of viewing the Chinese seal holographic projection under ambient lighting. The projection is bright and clear in the presence of strong background light in the room despite using only 2 mW of laser power. Projected on a white wall 135 cm away, the projection measures 12.5 cm across. Similar results were obtained using common commercially available Class 3R laser pointers with an output power of up to 5 mW. The large size of the projections also makes for convenient viewing of the holograms.

Figure 18:
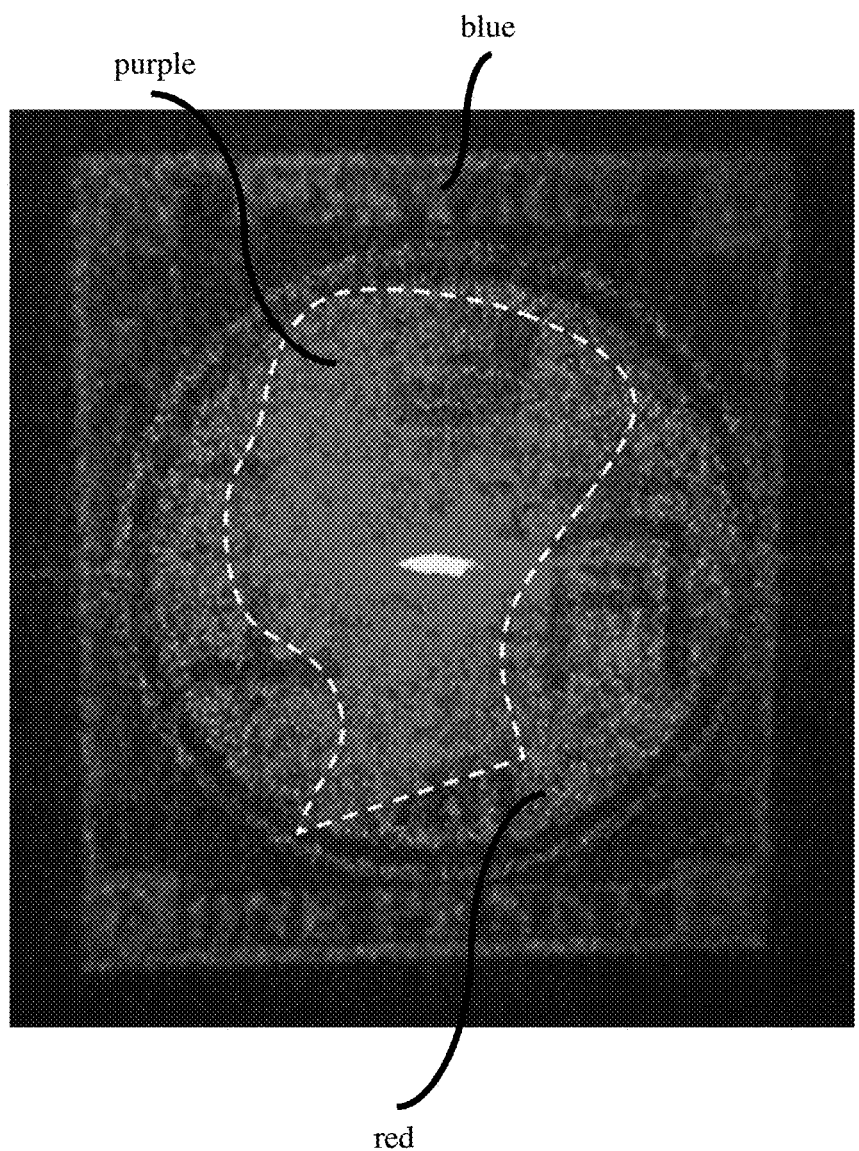
FIG. 18 illustrates simultaneous two-colour holographic projection from the exemplary QR code print, according to various example embodiments of the present invention.

Because of the on-axis nature of the projections, the projected images overlap perfectly as long as their illumination sources are collimated and collinear (beams sharing the same axis). For example, colour mixing of the red and blue lasers to give purple occurs in the overlap of the projections. This demonstrates the ability of the method according to various example embodiments to achieve multi-colour projection and show full colour holograms. In particular, FIG. 18 illustrates simultaneous two-colour holographic projection from the QR code print. Under illumination with collinear red and blue lasers, the side profile of Queen Victoria (white dashed outline) in the centre of the Penny Black stamp (blue) overlaps with the Chinese seal (red) and so appears magenta, demonstrating the possibility of achieving multi-colour projection. The projection distance is 135 cm.

Measuring Amplitude-Phase Coupling

As described hereinbefore, phase-amplitude coupling was minimised using a range of phase plate thicknesses that produced only minor variations in the colour of the pillar colour filters. Hence, various example embodiments have experimentally shown that phase variation would not greatly affect the amplitude. However, amplitude-phase coupling may still be present, i.e., the pillar colour filters may contribute an additional phase shift on top of that imparted by the underlying phase plates, such that control of amplitude also affects the phase. If this unwanted additional phase shift is significant and uncompensated, it could disrupt the holographic projections in multi-colour prints such as the Perfume print 700, which have more than one colour in each colour channel. Amplitude-phase coupling would not affect the QR code print because it imposes a uniform phase shift on each colour channel, which has no effect on the projections.

Figure 19:
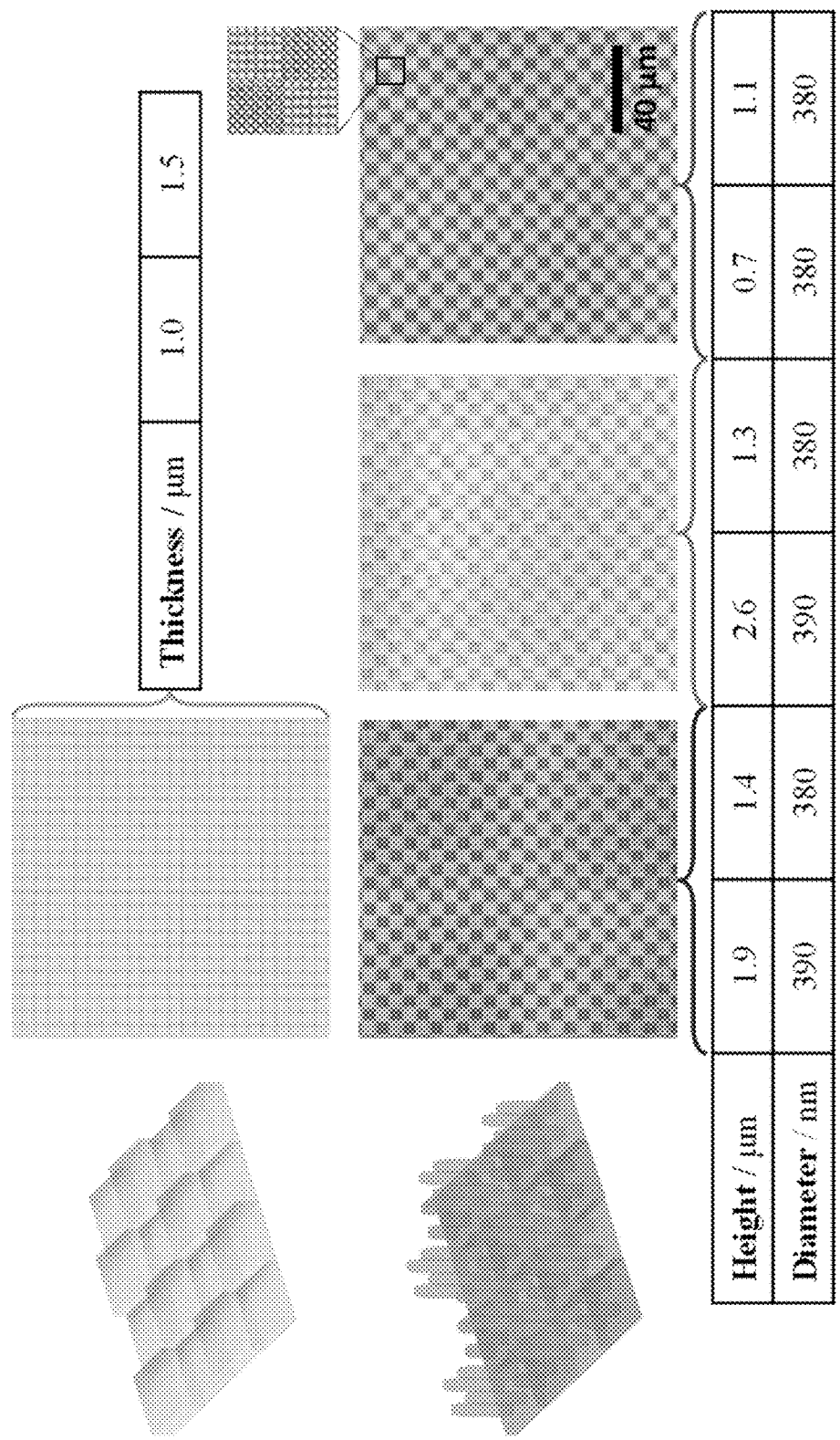
FIG. 19 shows exemplary binary phase gratings made of phase plates and pillars, according to various example embodiments of the present invention.

To quantify any phase shift caused by the pillar colour filters, various example embodiments fabricated and compared binary phase gratings with phase elements including either: (1) phase plate blocks of two different thicknesses, or (2) two sets of pillars with different dimensions arrayed on top of a base layer of blocks of uniform thickness. The phase plate grating (1) uses blocks of 1.0 and 1.5 µm thickness, which were chosen to produce relative phase shifts of approximately 0 and $\pi$ across the visible spectrum. For the pillar array gratings (2), pillars with significantly different dimensions were configured to maximise their phase difference, but with similar transmittances at the design wavelength so as to achieve a relatively flat amplitude profile across the grating. Under these conditions, any diffraction observed would be due primarily to a periodic phase variation created by the phase difference between the two sets of pillar arrays. Then comparing the power in the diffraction orders of gratings (1) and (2) allows us to directly compare the strength of phase modulation by blocks and pillar arrays. FIG. 19 shows the fabricated gratings and their dimensions according to various example embodiments.

In particular, FIG. 19 shows the binary phase gratings made of phase plates and pillars according to various example embodiments. Transmission optical micrographs of checkerboard binary phase gratings composed of: (top image) phase plates of thickness 1.0 and 1.5 µm, and (bottom images, starting from left) red, green and blue pillars, respectively, imaged with a 10×/0.20 NA objective. The inset was imaged with a 100×/0.90 NA objective. Schematics of the two grating types are shown on far left. The full checkerboards have 240×240 squares, where each square is a 2×2 super-pixel of holographic colour pixels (3×3 pillar array on top of a 3×3 µm$^2$ block) as shown in the inset in FIG. 19. In the pillar array gratings, the blocks form a constant 1.0 µm thick base layer while the squares alternate between two slightly different colours (different pillar dimensions) that have a similar transmittance at the design wavelength.

Figure 20:
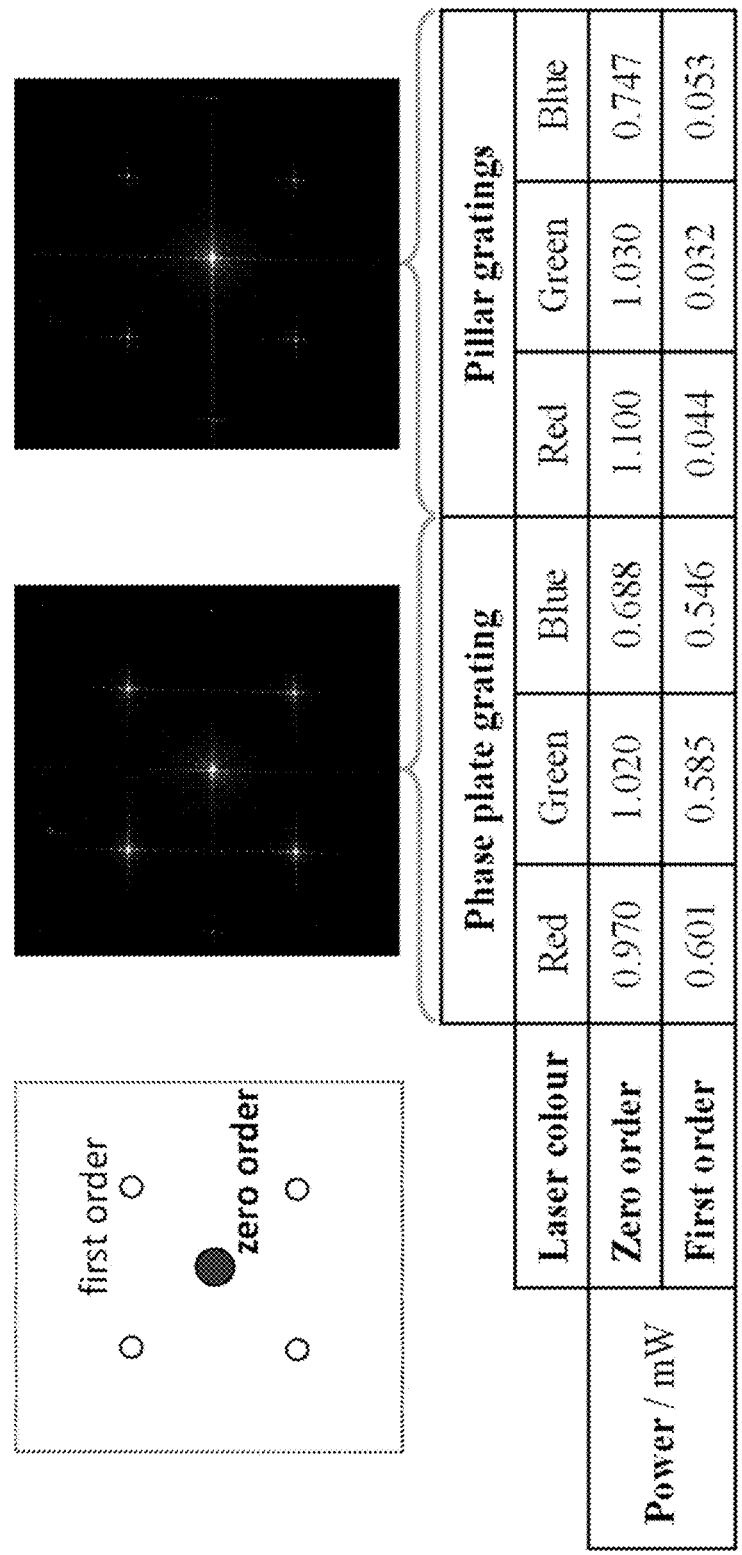
FIG. 20 depicts a comparison of the diffracted power for phase plate gratings and pillar array gratings, according to various example embodiments of the present invention.

It was observed that the power diffracted into the first order by the phase plate grating was more than ten times of that diffracted by the pillar array phase grating (e.g., see FIG. 20). This result shows that the colour filters may affect the phase of the transmitted light, but their effect is an order of magnitude smaller than that of the phase plate blocks. As such, it is reasonable to neglect amplitude-phase coupling in the design of holographic colour prints according to various example embodiments. Various example embodiments note that full characterisation of the phase imparted would allow straightforward correction of this coupling in the design stage by changing the underlying block thickness in each pixel to compensate for the extra phase, which could potentially improve the quality of the projections by a factor of about 10%.

In particular, FIG. 20 depicts a comparison of the diffracted power for phase plate gratings and pillar array gratings. As labelled in the top-left schematic, the power in the zero order is directly measured from the central bright spot (filled circle) while the power in the first order is summed over the four diffraction peaks (open circles) produced by the checkerboard gratings. The photographs of the diffraction patterns under red laser illumination show zero order spots of similar intensity but much stronger first order peaks for the phase plate grating, as confirmed by the measurements in the Table shown in FIG. 20. Misalignment errors during stitching of the write-fields in these prints introduce an additional periodicity along the x- and y-directions, which superimposes a horizontal and vertical flare on all the diffraction peaks. The flare does not substantially alter the results of the experiment as it reduces the power in each peak by an equal percentage. The same phase plate grating is measured with all three lasers (638 nm red, 527 nm green and 449 nm blue) while each pillar array grating is measured with the laser of the corresponding colour.

Efficiency Measurements

In various example embodiments, the transmission and diffraction efficiency of the QR code print was calculated and shown Table 2100 in FIG. 21. For simplicity, various example embodiments ignore the diffractive nature of the pillar colour filters and treat them as transmissive elements—the unwanted projections diffracted off-axis are considered to be rejected, while the on-axis central projection is passed (e.g., see FIG. 16). In this manner, various example embodiments may define the filter transmission efficiency on each channel as the ratio of the power in the central projection (transmitted through the print) to the power transmitted through bare glass at the design wavelength. Having accounted for the transmission characteristics, various example embodiments then define the hologram diffraction efficiency as the ratio of diffracted power (power in the central projection but not in the zero-order spot) to the power in the central projection.

The filter transmission efficiency of the QR code sample was measured using a power meter placed immediately before and after the sample. The transmission efficiency was measured to be 32% for blue and 34% for red laser illumination, close to the expected value of 34% for a about 50% area fraction of pixels with a transmittance of 68% (blue pixels at blue laser wavelength and yellow pixels at red laser wavelength). The hologram diffraction efficiency is 72% for the blue projection and 47% for the red projection. The overall efficiency of the print, calculated as the product of the transmission efficiency of the glass substrate, the filter transmission efficiency, and the hologram diffraction efficiency, is 21% for blue and 14% for red. These efficiencies are sufficient for the holographic projections from the prints according to various example embodiments to be visible at low laser power and in a bright environment as for example seen in FIG. 17. Further improvements in the hologram efficiency and overall efficiency may be made if future advances in the axial positioning accuracy of the laser writer allow the phase plate thickness profile of the holograms to more closely approximate their ideal phase profiles (e.g., see Section on "Phase Plate Thickness Calibration" as described hereinbefore).

Various example embodiments also calculated the on-axis transmission efficiency of the Perfume print 700 in FIG. 7A for showing a colour image under white light illumination. Taking the weighted average of the filter transmittances for white light (see Table 1200 in FIG. 12) with the proportion of pixels of the corresponding colours (e.g., see FIG. 7) resulted in an efficiency of 30%.

Accordingly, Table 2100 in FIG. 21 shows the efficiency of the QR code print according to various example embodiments. A power meter was used to collect the light in the central projection (including the zero-order spot) some distance from the print ("power in central projection") and solely within the zero-order spot at a farther distance ("power in zero-order spot"). In various example embodiments, further measurements were made, first replacing the print with an unpatterned glass substrate ("transmitted power") and then removing the print altogether ("incident power"). Power is given in units of mW.

Pixel Arrangements for Spatial Multiplexing of Holograms

Holographic colour prints lie on a continuum between colour images, in which the arrangement of pixels is rigidly defined, and multiplexed holograms, for which the arrangement of pixels is seemingly arbitrary. However, even if the requirement to form a colour image is removed, there are still restrictions on the types of pixel arrangements that can be used for hologram multiplexing. Because the holograms according to various example embodiments are Fraunhofer holograms that operate in the Fourier domain, the Fourier transform of the (real space) pixel arrangement enters into the determination of the final holographic projections—specifically, the final holographic projection is the spatial convolution of the designed holographic projection with the Fourier transform of the pixel arrangement. According to various example embodiments, the implications of this mathematical relationship on the design of multiplexed holograms are elaborated on in the following.

Adopting an idealised matrix representation of the pixel arrangement, the presence or absence of a hologram pixel at each location in space is denoted respectively by an amplitude of one or zero in the corresponding position of a 2D matrix (a binary mask). Then a matrix of ones corresponds to a hologram that completely fills the illuminated area and diverts the entire incident beam to project a desired image, whereas a matrix of zeroes corresponds to an illuminated area unoccupied by hologram pixels such that the incident beam passes straight through and remains as a spot.

In the space-division wavelength-multiplexing scheme according to various example embodiments, the pixels of each hologram only occupy part of the total area, which gives a "patchy" pixel arrangement on each wavelength channel. When pixels are removed from a complete, unmultiplexed hologram to create a patchy pixel arrangement (introducing zeroes into a matrix of ones), the undiffracted central (zero-order) bright spot increases in intensity at the expense of the projected image. While the projected image might then simply be expected to fade away gradually as pixels are removed, it can in fact become blurred or repeated. This is because the holographic projection is not only affected by the number of pixels remaining, but is also highly sensitive to the locations of the remaining pixels (i.e. the pixel arrangement).

For better understanding, consider that the Fourier transform of a constant amplitude profile (the pixel arrangement of a complete, unmultiplexed hologram) is a Dirac delta function and returns an identical projection after convolution. However, the Fourier transform of the pixel arrangement of a patchy hologram is a combination of a Dirac delta and some noise terms which draw power away from the Dirac delta. Convolution with such a "noisy delta" function may have the effect of creating unwanted copies of the holographic projection ("ghost images") that weaken and distract from the desired central projection.

These disturbances to the holographic projection can become especially pronounced when the Fourier transform has localised regions of high intensity noise that concentrate the ghost images and make them more apparent—which may be a particularly serious issue when imperfect wavelength selectivity causes them to appear as crosstalk on multiplexed channels. In general, any form of ordering or periodicity in a pixel arrangement may be manifested as clustering or peaks in its Fourier transform and thereby accentuate the crosstalk noise in multiplexed holographic projections, as shown in the simulated far field projections in FIGS. 22A to 22C.

In particular, FIGS. 22A to 22C illustrate the effect of pixel arrangement on multiplexed holograms. A comparison of 480×480 red, green, and blue (RGB) pixel arrangements for hologram multiplexing and simulated far field holographic projections, based on the RGB laser wavelengths and transmission spectra in FIG. 5B. Above each projection is the pixel arrangement for its colour channel, rescaled to show its key features (left image), and the Fourier transform of the pixel arrangement (right image). FIG. 22A illustrates an example random pixel arrangement in which individual RGB pixels are interspersed to give a featureless appearance. FIG. 22B illustrates an example "blocky" random pixel arrangement in which randomness is only applied down to a scale of 40-pixel blocks. FIG. 22C illustrates an example periodic pixel arrangement in which a 4×4 superpixel is tiled to fill the space. According to various example embodiments, the random arrangement shown in FIG. 22A may be the most suitable for hologram multiplexing as it accurately reproduces the source images with minimal crosstalk. With the blocky arrangement shown in FIG. 22B, unwanted "ghost images" are concentrated around the central holographic projection, forming a diffuse glow that highlights the crosstalk in the background. In the periodic arrangement shown in FIG. 22C, the ghost images are repeated across the Fourier plane at locations determined by the positions of peaks in the Fourier transform of the pixel arrangement.

Compared with a random pixel arrangement which produces three projections with little crosstalk (e.g., see FIG. 22A), a "blocky" pixel arrangement band-limits the Fourier power spectrum, which concentrates ghost images around the central projection and gives it a blurry appearance (e.g., see FIG. 22B). Meanwhile, a periodic pixel arrangement creates regular peaks in the power spectrum, which causes the tiling of ghost images in the Fourier plane (e.g., see FIG. 22C). The crosstalk, which is barely noticeable in FIG. 22A, becomes much more apparent in FIGS. 22B and 22C as the overlapping of ghost images enhances their visibility not only in their own channels but also on other channels.

Based on the above analysis, the optimal pixel arrangements for multiplexing according to various example embodiments are those which can spread out the ghost images by diffusing the noise power uniformly across the entire frequency domain to create a flat power spectrum, or equivalently, by generating a white noise signal in real space. Various example embodiments found that a convenient way to achieve a white noise spectrum was to use an error diffusion dithering algorithm to perform the necessary colour matching between the colour image to be printed and the colour palette available.

Various example embodiments use the Floyd-Steinberg error diffusion algorithm implemented in MATLAB as the built-in function dither. As compared to naively mapping a colour image to a more limited colour palette by directly applying error minimisation to each pixel, dithering diffuses the quantisation error of each pixel over its neighbouring pixels so as to spread out the error uniformly. Doing so improves the appearance of high-error regions with little degradation of low-error regions, thereby increasing the apparent quality of the recoloured image.

Apart from increasing the perceived colour accuracy beyond the results of simple error minimisation algorithms (which improves the quality of the colour print), dithering also minimises occurrence of large single-colour blocks of pixels, typically breaking them up into a complicated halftone pattern of various other colours. This scrambling of the colour pixels helps to randomise the pixel arrangement on each colour channel and generate a flatter power spectrum more similar to that of white noise (which improves the fidelity of holographic projections).

Figure 23:
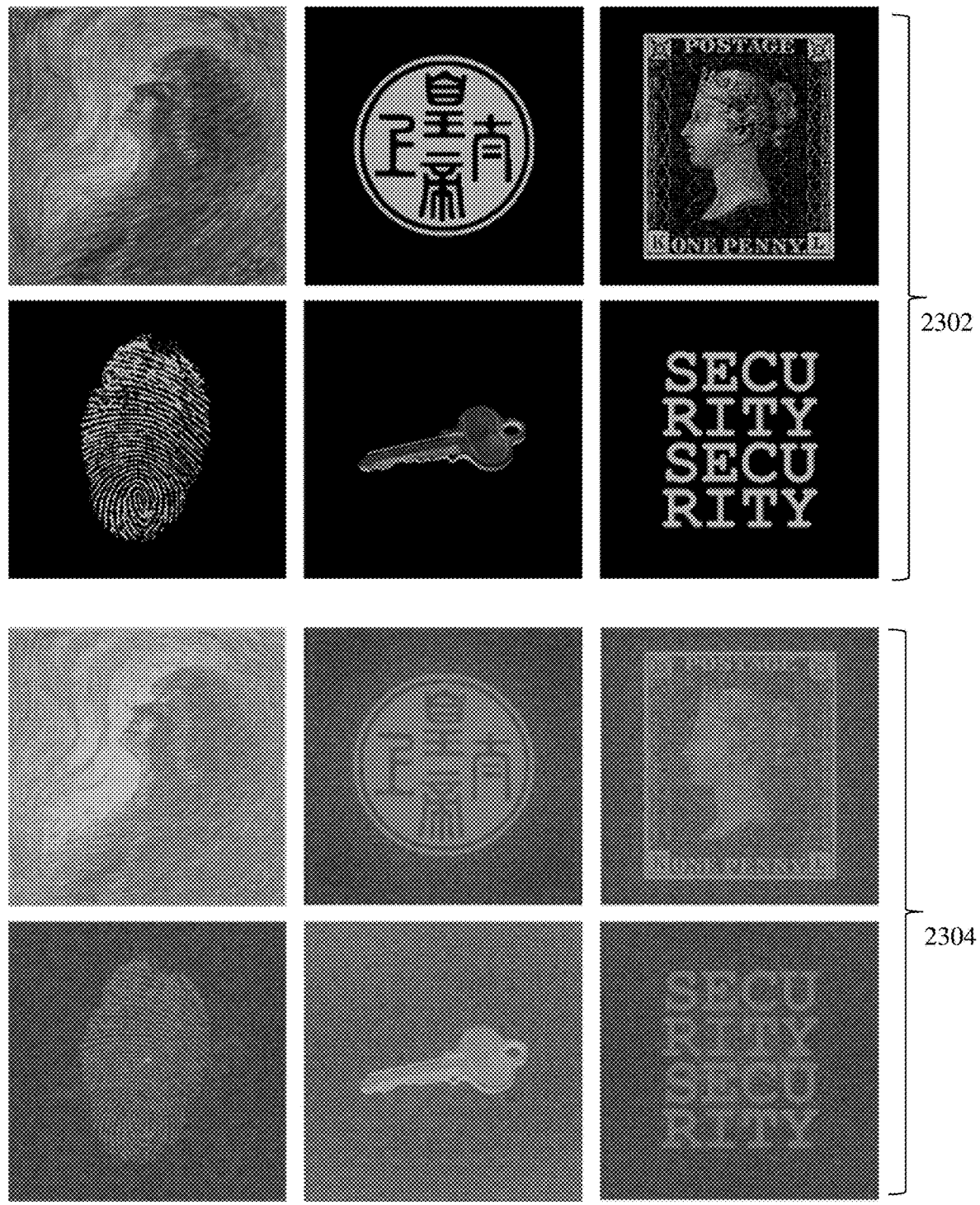
FIG. 23 shows the original source images and simulations, according to various example embodiments of the present invention.

FIG. 23 shows the original source images 2302 and simulations 2304 according to various example embodiments as described hereinbefore. In particular, source images 2302 and corresponding simulations 2304 of the Perfume colour print 700 and holographic projections are shown. Simulations are based on the RGB laser wavelengths and colour filter transmission spectra in FIG. 5B and the pixel layouts from FIGS. 6C and 7A. The colour print was simulated for a 1931 CIE 2° standard observer viewing under illuminant D65 (white light with a colour temperature of 6500 K).

Accordingly, various example embodiments are in the domain of optics and photonics, as the holographic optical element may be an optical or photonic component. Various example embodiments may provide a nanostructured surface obtained through nanofabrication processes, and such a physical embodiment may have applications in optical document security. In various example embodiments, the fields of nanofabrication and security may also be relevant.

Conventional phase holograms may project a single image when illuminated with a laser. Furthermore when viewed by eye, the plane of the hologram itself appears featureless because it contains phase information and not amplitude information. In contrast, in various example embodiments, by incorporating structural or other color filters onto the hologram, an image on the plane of the hologram may be produced, instead of a featureless patch. Furthermore, when illuminated with lasers of different colors, multiple grayscale images may be selected for holographic projection.

Various example embodiments provide a single optical element that simultaneously allows for amplitude control of transmitted white light to show a colour image and enables phase control of laser light to show several different holographic projections. Accordingly, wavelength multiplexing of holograms "hidden" under a colour print may be performed, which may serve as a multi-level security feature.

For example, a (microscopic) colour print of an image may be integrated with a hologram by patterning the colour image directly on top of the hologram. Thus the colour image is seen when viewing under white light, but a holographic projection is revealed upon illumination with laser light. By careful design (e.g., as described hereinbefore according to various example embodiments), more than one hologram may be incorporated into the same colour print. Various example embodiments use the colour print as a colour filter layer to provide wavelength selectivity for viewing of one or more different holograms. Accordingly, various example embodiments provide a wavelength-multiplexing scheme or technique for holograms, where several holograms are combined by dividing the space into regions of arbitrary shapes and sizes onto which colour filters are patterned. When the multiplexed hologram is illuminated, the colour filters select the appropriate projection by allowing or hindering the passage of the different wavelengths of light. The colour filter layer can also be designed to show a separate colour image, independent of the information encoded in the holograms. Accordingly, various example embodiments may be applicable to both transmission and reflection holograms, and may be most easily implemented using computer-generated holography to calculate or determine the holograms and micro/nano-fabrication techniques for creating the physical form of the holograms.

In various example embodiments, because the encoded information is distributed throughout all parts of a hologram, even an incomplete copy of a hologram (for example a random subset of the hologram) can produce the desired holographic projection, albeit with some errors and loss of resolution. Exploiting this robustness to missing parts, holograms designed for use at different wavelengths can be patterned within the same area by removing selected regions of each hologram to prevent overlaps between the spatially co-located holograms. In various example embodiments, colour filters are fabricated on the respective regions assigned to each hologram, so that each region allows passage of the appropriate wavelength of light for its hologram and hinders the passage of the others. In this way, illumination of the entire hologram with each wavelength of light will project only the correct grayscale image of each colour (from the appropriate regions) while the other unwanted images (arising from illumination of regions designed for other wavelengths) are either not produced or discarded.

In various example embodiments, the holograms may be considered to be wavelength-multiplexed into different colour channels, as each hologram encodes an independent set of information which can be accessed and separated based on the illumination wavelength. For example, the multiplexed holograms fit together like coloured jigsaw puzzle pieces, which may be arranged in any random or aperiodic fashion (to avoid superimposing an additional periodicity onto the holographic projections). By choosing to assign the spatial regions for each colour channel in a specific way, the physical hologram itself can be made in the shape of a colour image which is independent of the encoded hologram information. In various example embodiments, the colour range of the image can be improved by allowing more variation in the colour filters used, at the expense of the wavelength selectivity of the grayscale holographic projections.

In various example embodiments and in practice, a reasonable balance between colour range and wavelength selectivity can be achieved such that two or more grayscale holograms can be encoded into an unrelated colour image, creating an unusual and unique micro-print that may be useful in security applications.

Accordingly, various example embodiments have successfully demonstrated the encoding of two different grayscale holograms into a holographic colour microprint of a completely unrelated colour image. As mentioned hereinbefore, while various example embodiments have been described with respect to transmission holograms, it will be appreciated to a person skilled in the art that the present invention is also applicable to reflection holograms and is within the scope of the present invention.

In various example embodiments, the holographic colour microprint may be understood as a stack of two independent optical elements, one as a phase hologram and the other as an amplitude image. This allows for two degrees of freedom at each position in the holographic microprint, namely, blocks control the phase in a wavelength-dependent manner according to their thickness, while pillars control the amplitude in a wavelength-dependent manner according to their transmission or reflection spectrum.

In various example embodiments, for illustration purposes to demonstrate an example design or configuration of the holographic optical element and without limitation, dielectric nano-pillars are used as transmission colour filters and dielectric nano-blocks are used as transmission phase plates, as described hereinbefore. In this regard, an array of nano-pillars with varying height and diameter may serve as a colour print, and an array of nano-blocks with varying thickness may serve as a computer-generated hologram. In various example embodiments, by layering or disposing the nano-pillar array directly on top of the nano-block array, the desired outcome of colour image formation and hologram multiplexing can be achieved.

In various example embodiments, together, the nano-pillars and nano-blocks may form a monolithic structure that can be fabricated in a single step process by 3D direct laser writing in a suitable negative-tone photoresist, as described hereinbefore. For example, the 2.5D nature of the structure suggests that it is possible to mass produce by a nano-imprinting process.

In various example embodiments, the dimensions of nano-pillars: height may be in a range from 0.5 to 3.0 µm; and diameter may be in a range from 100 to 500 nm. The dimensions of nano-blocks: thickness may be in a range from 50 nm to 2000 nm; lateral size (e.g., width and length) may be in a range from 1 to 10 µm.

Various example embodiments note that although the pillars may impart a phase shift to the light and thereby introduce errors in the hologram phase, this may be compensated for by applying an appropriate correction to the thickness of each underlying block, which may be varied independently of the pillars. Alternatively, the height and diameter of the pillars may be varied to compensate for shifts in the pillar colour due to the presence of underlying blocks. In various example embodiments, a balance between the two types of compensation may be sought in order to achieve optimal performance.

In various example embodiments, it was found that the performance of the experimentally demonstrated holographic colour microprint is reasonably good even without applying these sorts of compensation. The colour image and hidden holograms are also relatively robust to fabrication errors such as slanting pillars and distorted blocks.

In various example embodiments, one full-colour image and multiple grayscale images may be simultaneously encoded into a single holographic colour microprint. The microprint itself shows the full-colour image when illuminated with white light, and can be easily seen under a magnifying glass. Meanwhile, illumination with laser light at each hologram design wavelength projects a corresponding grayscale image that is viewable by eye when cast on any suitable surface such as a wall or floor. The holographic projections are naturally parallel and coaxial, and are thus perfectly aligned at any distance without the need to introduce any additional physical components or design modifications.

In various example embodiments, the holograms are relatively angle-insensitive unlike those in the angular multiplexing (object plane space-division) method, for which the holograms require a fixed readout geometry with specific illumination angles for each colour, and may require the use of a microscope to view the projections.

In various example embodiments, the laser light sources do not need to be positioned on specific areas of the hologram, and broad illumination across the hologram is sufficient.

Accordingly, the holographic optical element (e.g., microprints) according to various example embodiments may be used as security prints for anti-counterfeiting applications, for example, on bank notes or important documents to provide optical security. For example, while the colour print may possibly be duplicated by high-resolution colour printing, the underlying "hidden" holograms are very difficult or impossible to replicate with any standard printing process unless a master of the holographic microprint is available. This allows for an additional degree of security as compared to conventional colour microprints.

Accordingly, various example embodiments advantageously allow the design requirements of several holograms and a colour image to be decoupled by separating the holograms and the colour elements into different layers (or different portions). Various example embodiments enable the different layers (e.g., the two layers) to be constructed as a single monolithically integrated holographic microprint, whereby the multiplexed holograms are intimately intermixed throughout the space (or area) of the hologram layer (or hologram portion).

While embodiments of the present invention have been particularly shown and described with reference to specific embodiments, it should be understood by those skilled in the art that various changes in form and detail may be made therein without departing from the scope of the present invention as defined by the appended claims. The scope of the present invention is thus indicated by the appended claims and all changes which come within the meaning and range of equivalency of the claims are therefore intended to be embraced.

What is claimed is:

1. A holographic optical element comprising:
a hologram portion comprising a plurality of groups of unit regions, each group of unit regions of the hologram portion being configured to produce a respective holographic image under a respective light illumination having a respective predetermined wavelength; and
a colour filter portion formed on the hologram portion, the colour filter portion comprising a plurality of groups of unit regions, each group of unit regions of the colour filter portion being arranged on a corresponding group of the plurality of groups of unit regions of the hologram portion,
wherein the plurality of groups of unit regions of the colour filter portion is spatially arranged to collectively form a predetermined colour image thereon viewable under a white light illumination, and
wherein the light illuminations associated with the plurality of groups of unit regions of the hologram portion, respectively, for producing the respective holographic images are laser illuminations and the respective predetermined wavelengths of the laser illuminations are different from each other.

2. The holographic optical element according to claim 1, wherein at least one of the groups of unit regions is interspersed amongst one or more other groups of the plurality of groups of unit regions.

3. The holographic optical element according to claim 1, wherein each group of unit regions of the colour filter portion is configured with wavelength selectivity for the light illumination associated with the corresponding group of the plurality of groups of unit regions of the hologram portion and against at least one of one or more light illuminations associated with one or more remaining groups, respectively, of the plurality of groups of unit regions of the hologram portion.

4. The holographic optical element according to claim 3, wherein each group of unit regions of the colour filter portion is configured with wavelength selectivity for the light illumination associated with the corresponding group of the plurality of groups of unit regions of the hologram portion and against each of the one or more light illuminations associated with the one or more remaining groups, respectively, of the plurality of groups of unit regions of the hologram portion.

5. The holographic optical element according to claim 1, wherein the plurality of groups of unit regions of the hologram portion is spatially arranged to correspond to the spatial arrangement of the plurality of groups of unit regions of the colour filter portion forming the predetermined colour image, and each group of the plurality of groups of unit regions of the hologram portion is configured to produce the respective holographic image based on the spatial arrangement of the group of unit regions of the hologram portion.

6. The holographic optical element according to claim 5, wherein each unit region of the group of unit regions of the hologram portion comprises a thickness respectively configured for modifying a phase of the light illumination associated therewith such that the group of unit regions of the hologram portion collectively produce the respective holographic image under the light illumination.

7. The holographic optical element according to claim 6, wherein the thickness is in a range of 0.6 µm to 1.8 µm.

8. The holographic optical element according to claim 1, wherein each unit region of the group of unit regions of the colour filter portion comprises a spectral profile respectively configured to allow passage of the light illumination associated with the corresponding group of the plurality of groups of unit regions of the hologram portion and to hinder passage of each of the one or more light illuminations associated with the one or more remaining groups, respectively, of the plurality of groups of unit regions of the hologram portion.

9. The holographic optical element according to claim 1, wherein each unit region of the group of unit regions of the colour filter comprises an array of pillar structures.

10. The holographic optical element according to claim 1, wherein the hologram portion and the colour filter portion are made of a dielectric material.

11. The holographic optical element according to claim 1, wherein the hologram portion and the colour filter portion are formed as a monolithic structure.

12. The holographic optical element according to claim 1, wherein the laser illuminations associated with the plurality of groups of unit regions of the hologram portion are each selected from a group consisting of a red laser illumination, a green laser illumination and a blue laser illumination.

13. A method of forming a holographic optical element, the method comprising:
forming a hologram portion comprising a plurality of groups of unit regions, each group of unit regions of the hologram portion being configured to produce a respective holographic image under a respective light illumination having a respective predetermined wavelength; and
forming a colour filter portion on the hologram portion, the colour filter portion comprising a plurality of groups of unit regions, each group of unit regions of the colour filter portion being arranged on a corresponding group of the plurality of groups of unit regions of the hologram portion,
wherein said forming the colour filter portion comprises spatially arranging the plurality of groups of unit regions of the colour filter portion to collectively form a predetermined colour image thereon viewable under a white light illumination, and
wherein the light illuminations associated with the plurality of groups of unit regions of the hologram portion, respectively, for producing the respective holographic images are laser illuminations and the respective predetermined wavelengths of the laser illuminations are different from each other.

14. The method according to claim 13, wherein said forming the colour filter portion further comprises interspersing at least one of the groups of unit regions amongst one or more other groups of the plurality of groups of unit regions.

15. The method according to claim 13, wherein said forming the colour filter portion further comprises configuring each group of unit regions of the colour filter portion with wavelength selectivity for the light illumination associated with the corresponding group of the plurality of groups of unit regions of the hologram portion and against at least one of one or more light illuminations associated with one or more remaining groups, respectively, of the plurality of groups of unit regions of the hologram portion.

16. The method according to claim 15, wherein each group of unit regions of the colour filter portion is configured with wavelength selectivity for the light illumination associated with the corresponding group of the plurality of groups of unit regions of the hologram portion and against each of the one or more light illuminations associated with the one or more remaining groups, respectively, of the plurality of groups of unit regions of the hologram portion.

17. The method according to claim 13, wherein said forming the hologram portion further comprises:
spatially arranging the plurality of groups of unit regions of the hologram portion to correspond to the spatial arrangement of the plurality of groups of unit regions of the colour filter portion forming the predetermined colour image; and
configuring each group of the plurality of groups of unit regions of the hologram portion to produce the respective holographic image based on the spatial arrangement of the group of unit regions of the hologram portion.

18. The method according to claim 17, wherein said forming the hologram portion further comprises:
configuring respectively each unit region of the group of unit regions of the hologram portion to have a thickness for modifying a phase of the light illumination associated therewith such that the group of unit regions of the hologram portion collectively produce the respective holographic image under the light illumination.

19. The method according to claim 13, wherein said forming the colour filter portion further comprises:
configuring respectively each unit region of the group of unit regions of the colour filter portion to have a spectral profile for allowing passage of the light illumination associated with the corresponding group of the plurality of groups of unit regions of the hologram portion and for hindering passage of each of the one or more light illuminations associated with the one or more remaining groups, respectively, of the plurality of groups of unit regions of the hologram portion.

20. An article having optical security incorporated therein, the article comprising:
a substrate; and
one or more holographic optical elements formed on the substrate for providing the optical security, each of the one or more holographic optical elements comprising:
a hologram portion comprising a plurality of groups of unit regions, each group of unit regions of the hologram portion being configured to produce a respective holographic image under a respective light illumination having a respective predetermined wavelength; and
a colour filter portion formed on the hologram portion, the colour filter portion comprising a plurality of groups of unit regions, each group of unit regions of the colour filter portion being arranged on a corresponding group of the plurality of groups of unit regions of the hologram portion,
wherein the plurality of groups of unit regions of the colour filter portion is spatially arranged to collectively form a predetermined colour image thereon viewable under a white light illumination, and
wherein the light illuminations associated with the plurality of groups of unit regions of the hologram portion respectively, for producing the respective holographic images are laser illuminations and the respective predetermined wavelengths of the laser illuminations are different from each other.

* * * * *